United States Patent
Hashiguchi et al.

(10) Patent No.: US 7,849,515 B2
(45) Date of Patent: Dec. 7, 2010

(54) NANOTWEEZER AND SCANNING PROBE MICROSCOPE EQUIPPED WITH NANOTWEEZER

(75) Inventors: Gen Hashiguchi, Takamatsu (JP); Maho Hosogi, Takamatsu (JP); Takashi Konno, Takamatsu (JP)

(73) Assignees: National University Corporation Kagawa University, Takamatsu-shi (JP); AOI Electronics Co., Ltd., Takamatsu-shi (JP)

( * ) Notice: Subject to any disclaimer, the term of this patent is extended or adjusted under 35 U.S.C. 154(b) by 421 days.

(21) Appl. No.: 11/791,262

(22) PCT Filed: Nov. 22, 2005

(86) PCT No.: PCT/JP2005/021456

§ 371 (c)(1),
(2), (4) Date: Jan. 25, 2008

(87) PCT Pub. No.: WO2006/054771

PCT Pub. Date: May 26, 2006

(65) Prior Publication Data

US 2009/0000362 A1    Jan. 1, 2009

(30) Foreign Application Priority Data

Nov. 22, 2004  (JP) ............................. 2004-337842
Feb. 18, 2005  (JP) ............................. 2005-042883

(51) Int. Cl.
*G01Q 30/20*   (2010.01)

(52) U.S. Cl. ............................... 850/18; 850/8; 850/52; 850/56; 977/902; 977/962; 901/31

(58) Field of Classification Search ................... 73/863, 73/863.11, 104, 105; 850/8, 9, 13, 18, 53, 850/58, 1, 2, 3, 4, 19, 26, 29, 33, 43, 44, 850/46, 52, 56, 59, 62, 63; 977/962, 902; 294/86.4, 99.1, 103.1; 901/30, 31, 39
See application file for complete search history.

(56) References Cited

U.S. PATENT DOCUMENTS 4,927,254 A    5/1990    Kino et al.
(Continued)

FOREIGN PATENT DOCUMENTS

JP    58-4389    1/1983
(Continued)

OTHER PUBLICATIONS

G. Hashiguchi, et. al.; "A Micromachined Nano tweezers Integrated with a Thermal Expansion Micro Actuator"; The Transactions of the Institute of Electrical Engineers of Japan E; The Institute of Electrical Engineers of Japan; 2003; VO. 123-E, No. 1, pp. 1-8.
International Search Report dated Mar. 14, 2006 (Three (3) pages).

*Primary Examiner*—Jack I Berman
*Assistant Examiner*—Nicole Ippolito Rausch
(74) *Attorney, Agent, or Firm*—Crowell & Moring LLP

(57) ABSTRACT

A nanotweezer (1) according to the present invention includes: a supporting member (25); an observation probe (10) that projects out from the supporting member (25), and is used when observing a surface of a specimen; a movable arm (20) that is arranged next to the observation probe (10) projecting out from the supporting member (25), and makes closed or opened between the observation probe (10) and the movable arm (20) to hold or release the specimen held between the observation probe (10) and the movable arm (20); and a drive mechanism that drives the movable arm (20) so as to make closed or opened between the observation probe (10) and the movable arm (20), and the supporting member (25), the observation probe (10) and the movable arm (20) are each formed by processing a semiconductor wafer (30) through a photolithography process.

19 Claims, 32 Drawing Sheets

U.S. PATENT DOCUMENTS

| | | | |
|---|---|---|---|
| 5,760,396 A * | 6/1998 | Lindsay et al. | 850/1 |
| 6,094,972 A | 8/2000 | Yasutake et al. | |
| 2002/0061662 A1 | 5/2002 | Boggild | |
| 2002/0122766 A1 | 9/2002 | Lieber et al. | |
| 2002/0158480 A1 | 10/2002 | Nakayama et al. | |
| 2005/0029827 A1 * | 2/2005 | Hashiguchi et al. | 294/86.4 |
| 2005/0133717 A1 | 6/2005 | Sadayama et al. | |
| 2005/0145021 A1 * | 7/2005 | Chand et al. | 73/105 |
| 2007/0119241 A1 * | 5/2007 | Su et al. | 73/105 |

FOREIGN PATENT DOCUMENTS

| | | |
|---|---|---|
| JP | 8-90431 A | 4/1996 |
| JP | 11-44697 A | 2/1999 |
| JP | 2001-252900 A | 9/2001 |
| JP | 2004-28830 A | 1/2004 |
| JP | 2004-317255 A | 11/2004 |
| WO | WO03045838 * | 5/2003 |
| WO | WO 03/045838 A1 | 6/2003 |

* cited by examiner

FIG.2
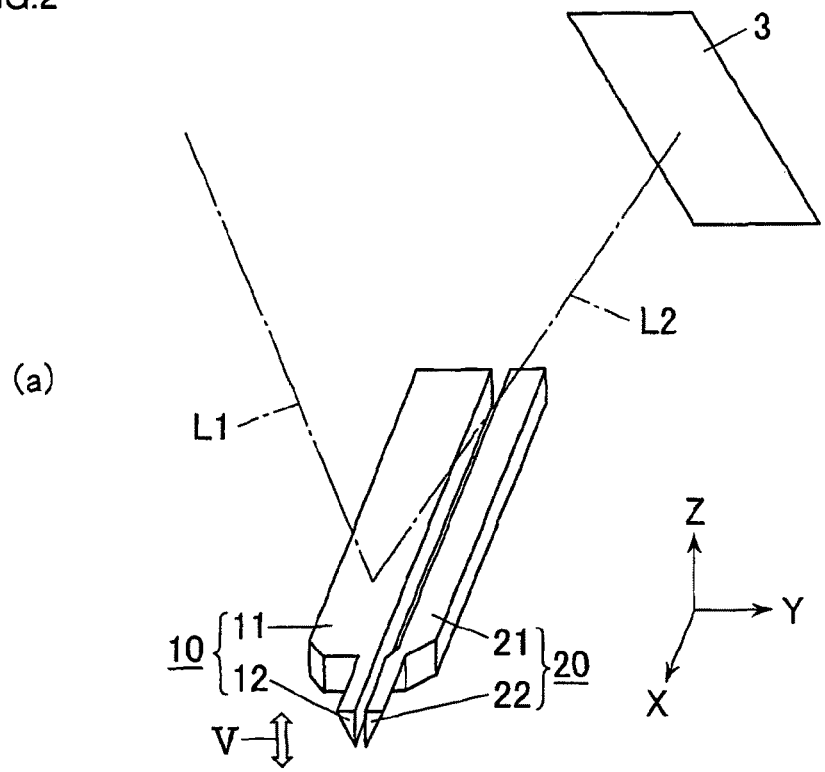
(a)
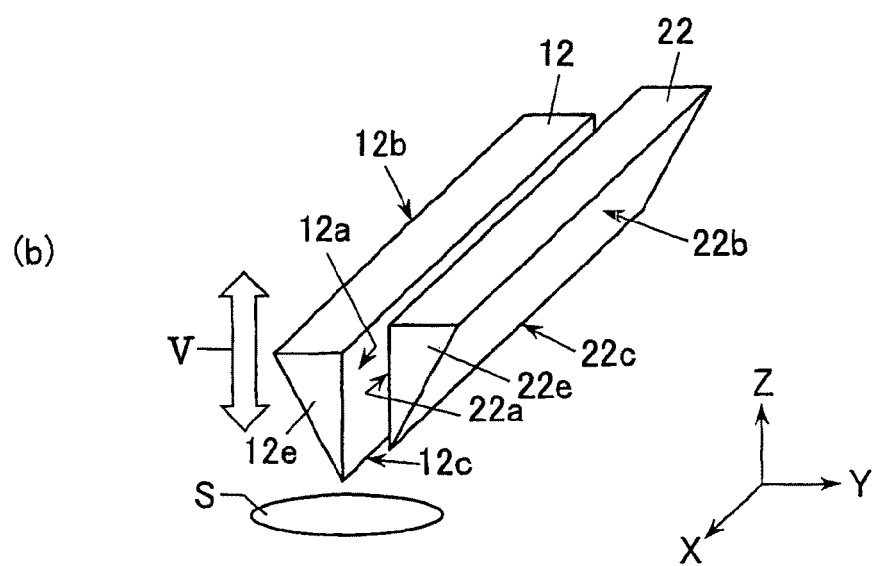
(b)

FIG. 5
(a1) step a
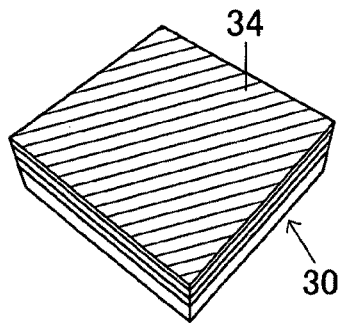
(a2) step a
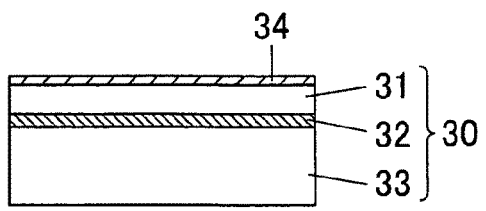
(b1) step b
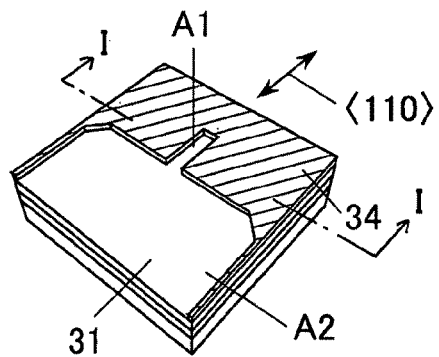
(b2) step b
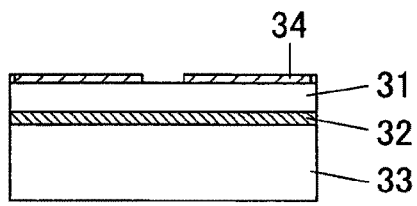
(sectional view taken along I-I)
(c1) step c
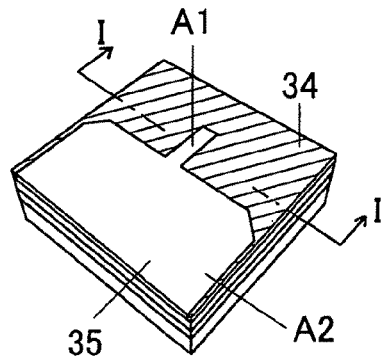
(c2) step c
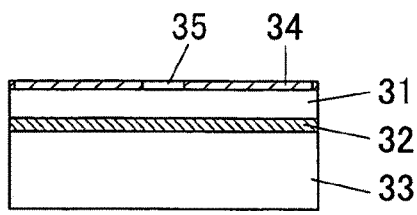
(sectional view taken along I-I)

FIG.7
(a) 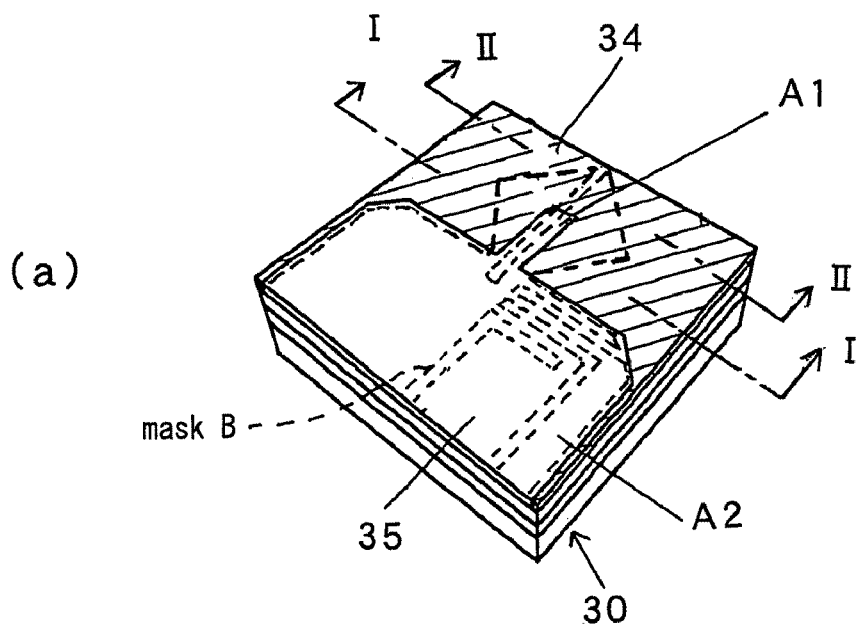
(b) 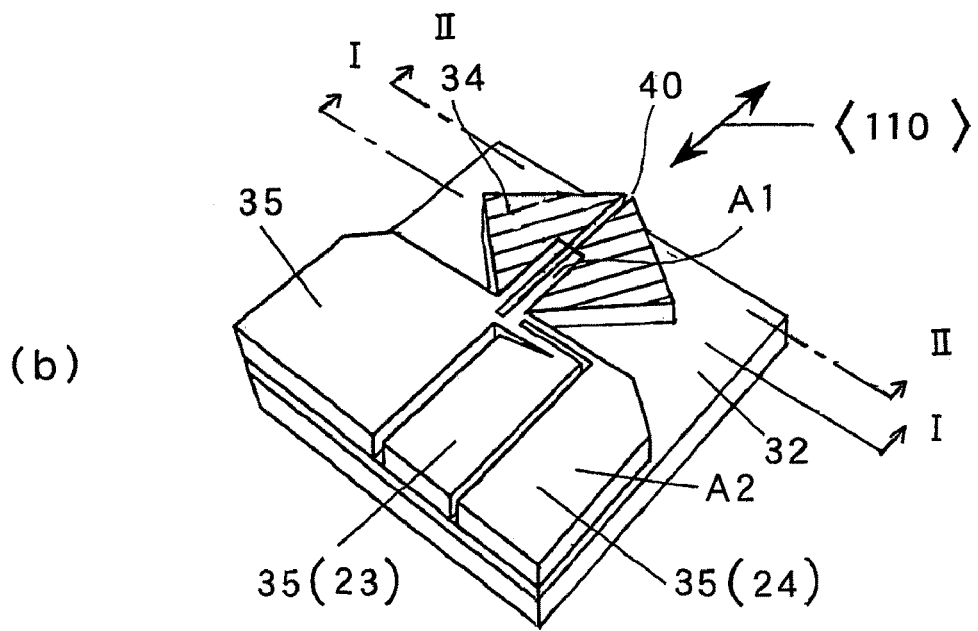

FIG. 10
(sectional view taken along I-I)
(a)
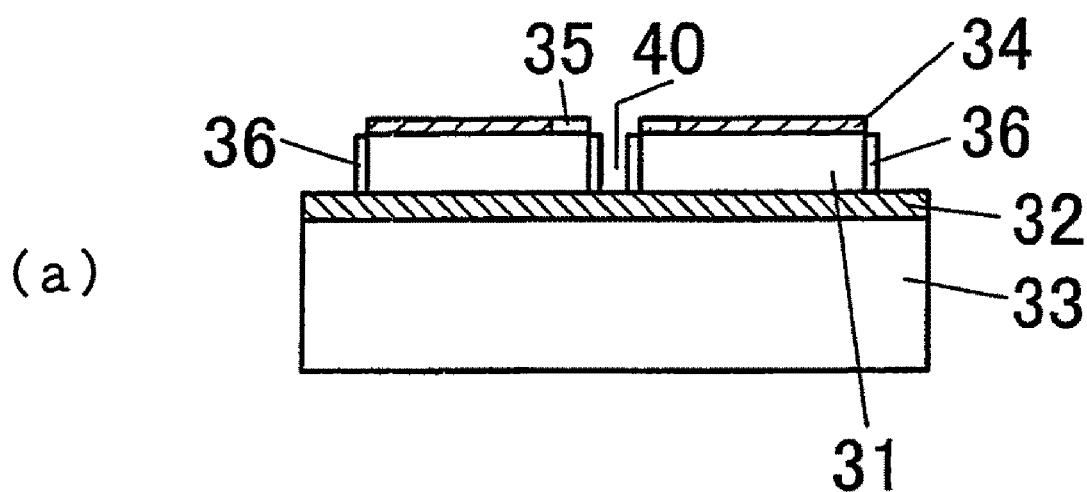
(sectional view taken along II-II)
(b)
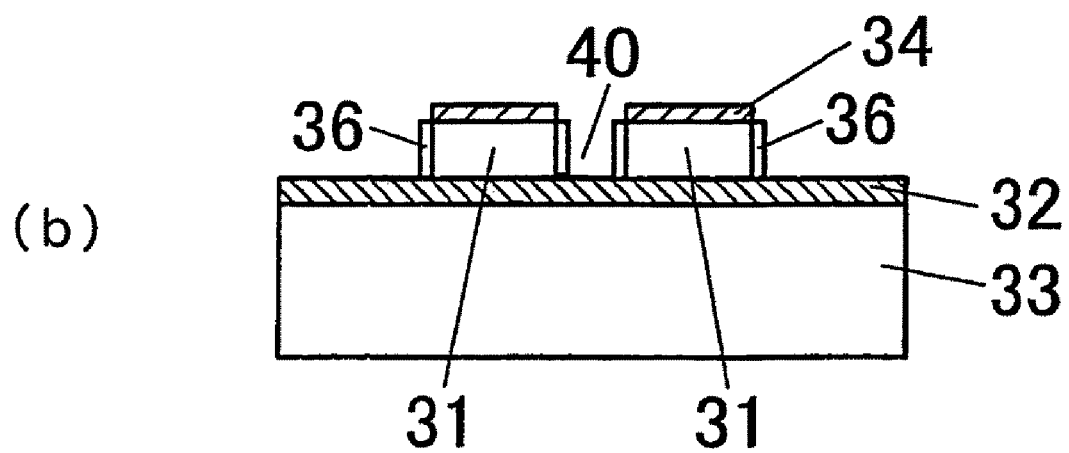

FIG. 11
(sectional view taken along I-I)
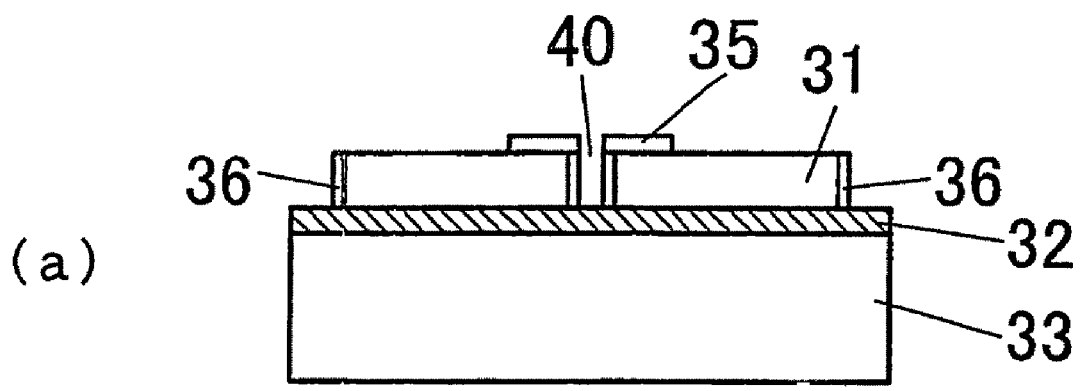
(a)
(sectional view taken along II-II)
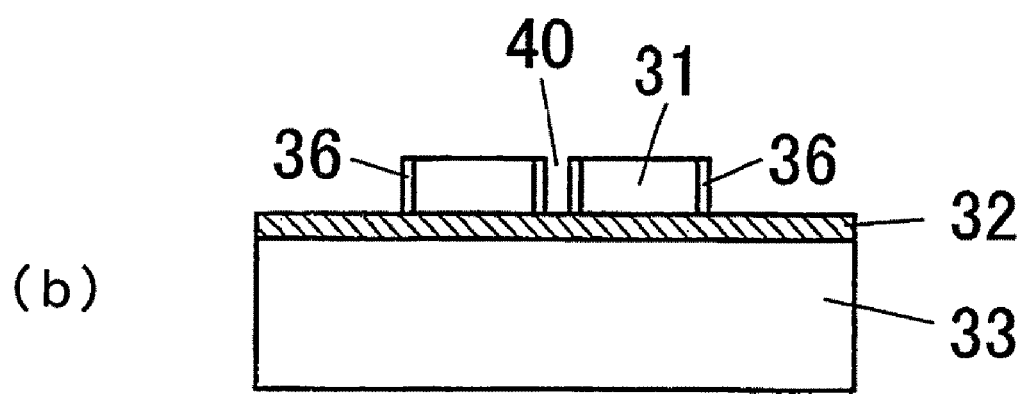
(b)

FIG. 13
(a1) step g
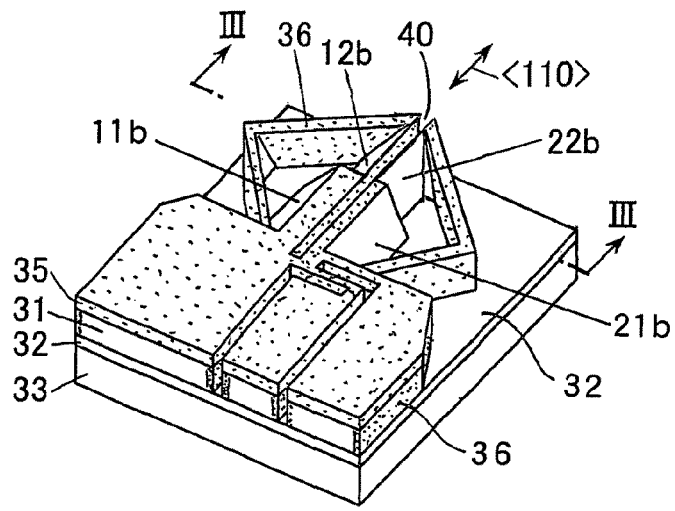
(a2) step g
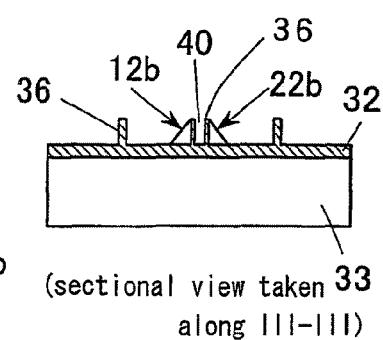
(sectional view taken along III-III)
(b1) step h
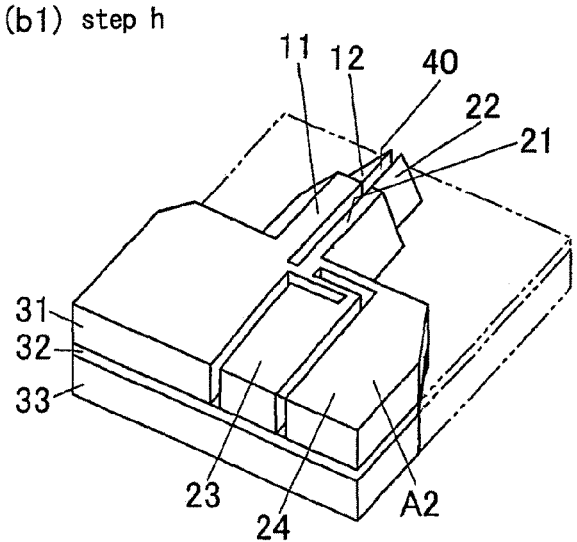

FIG. 16
(a)
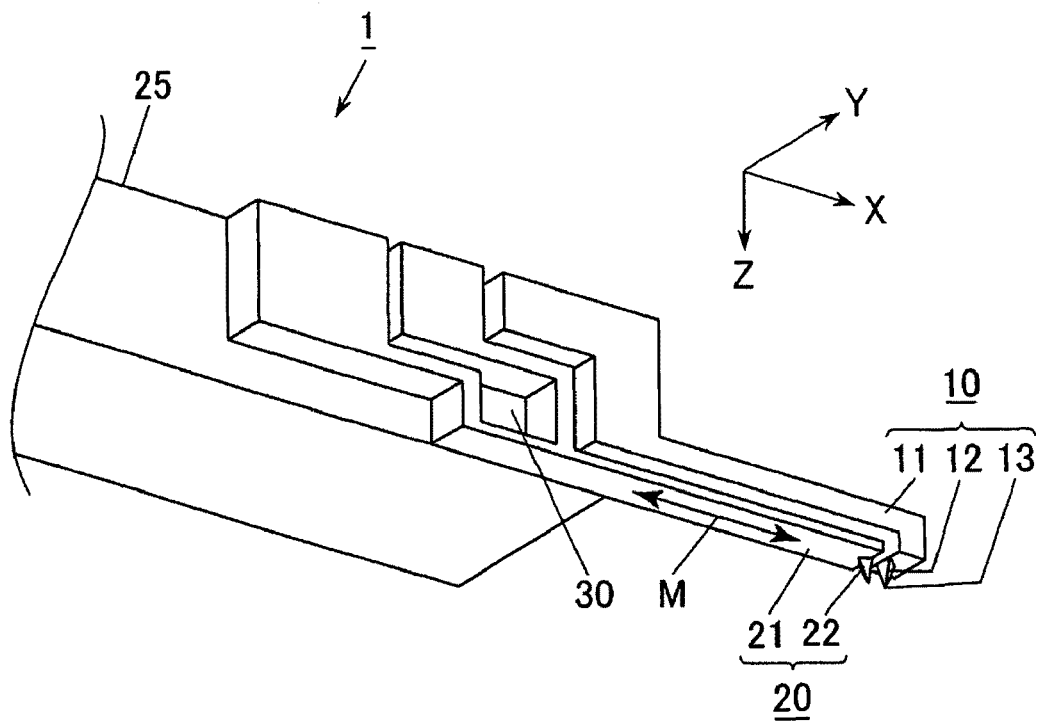
(b)
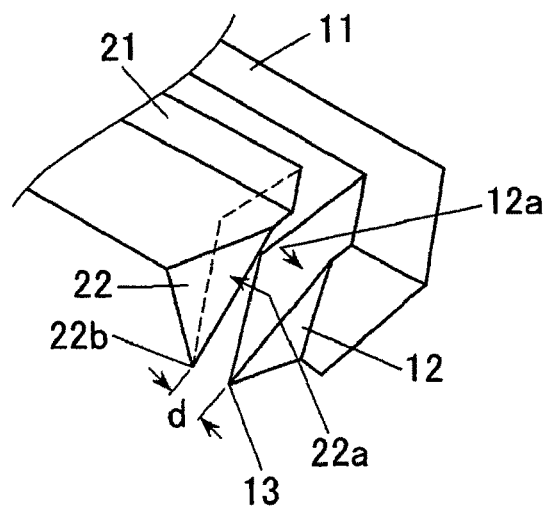

FIG.17
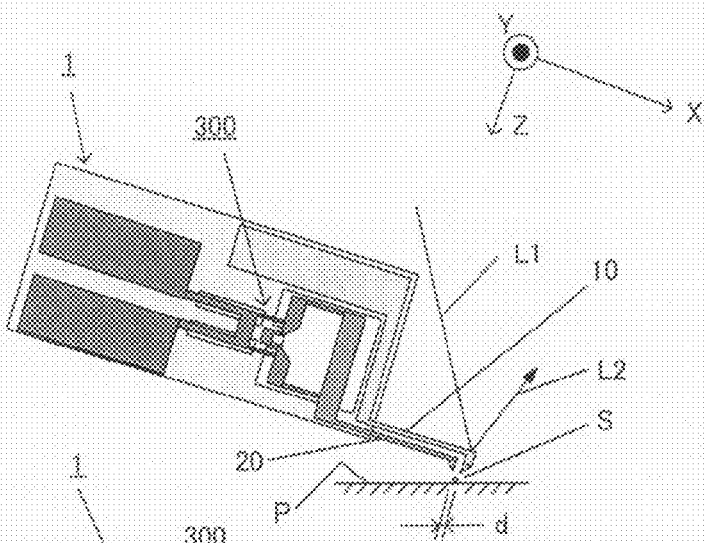
(a) distance d = d0
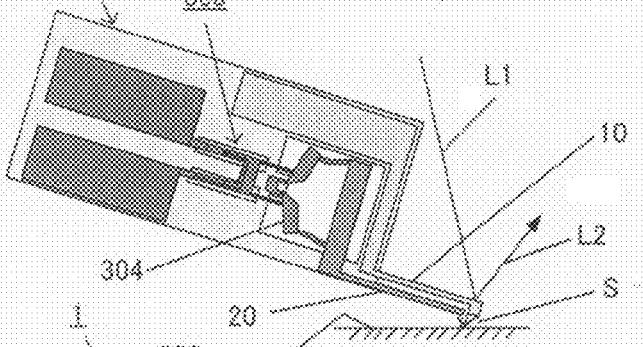
(b) d=d₁
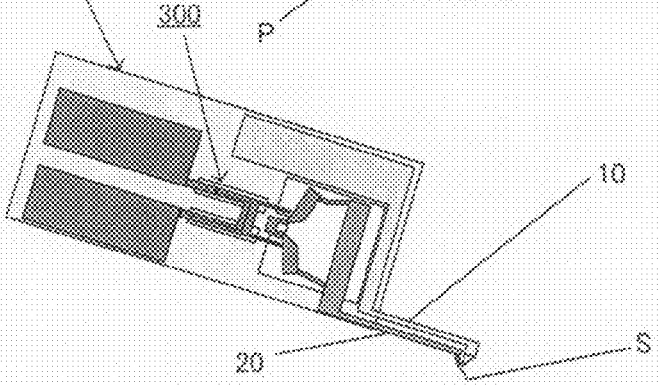
(c) d=d₁

FIG.20
(a1) step g    (a2) step g
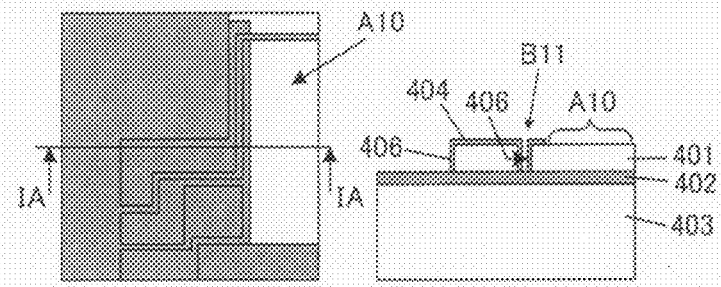
(b1) step h    (b2) step h
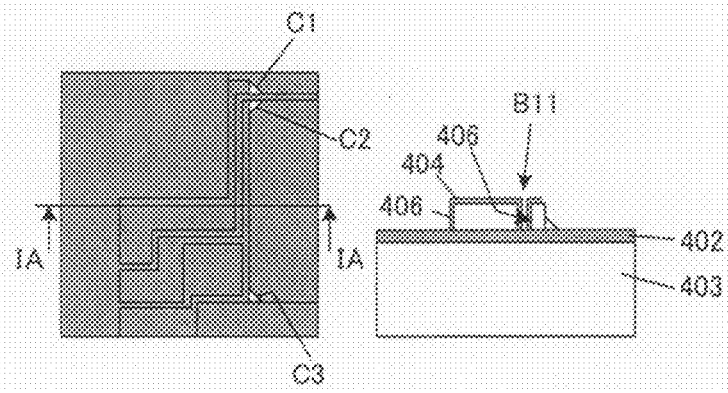
(c3)    (c1) step i    (c2) step i
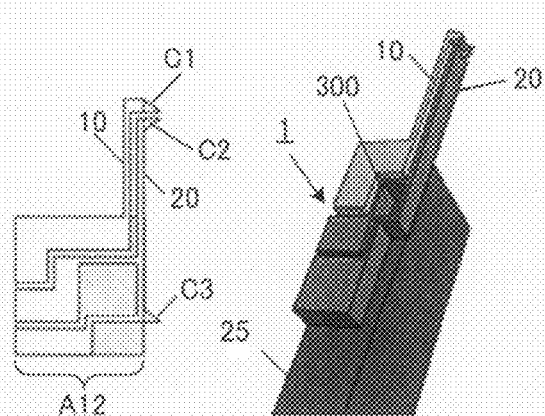

FIG.29
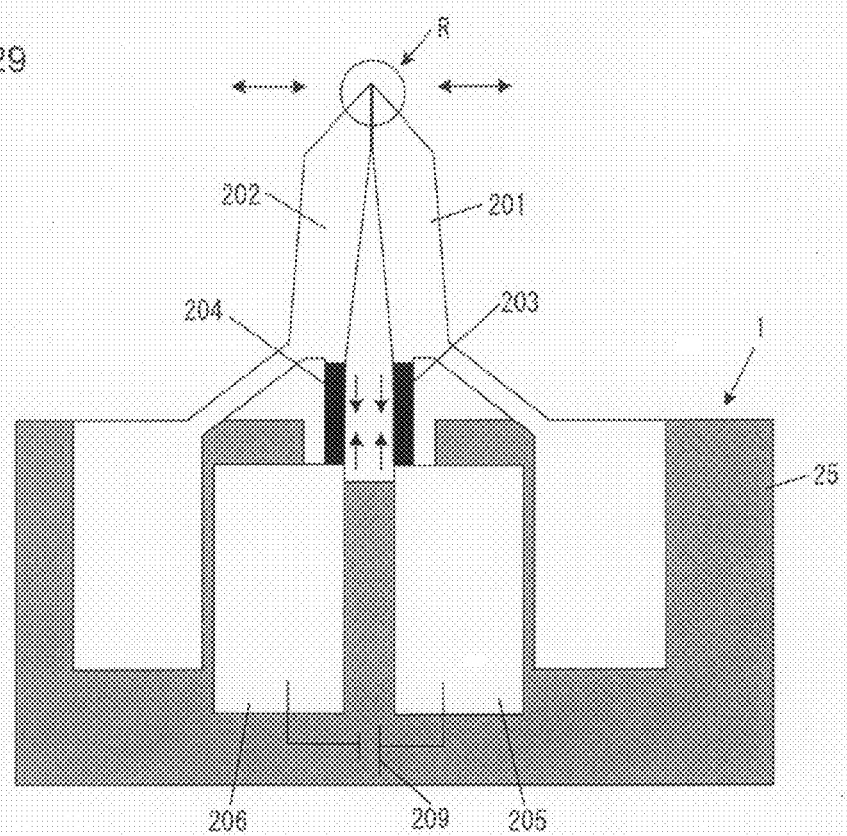
(a)
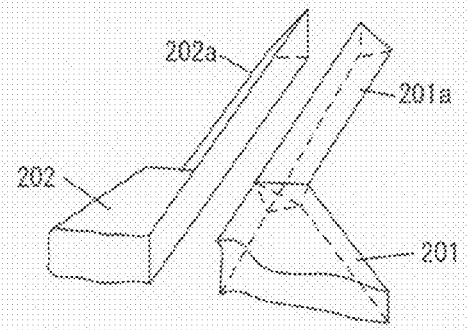
(b)
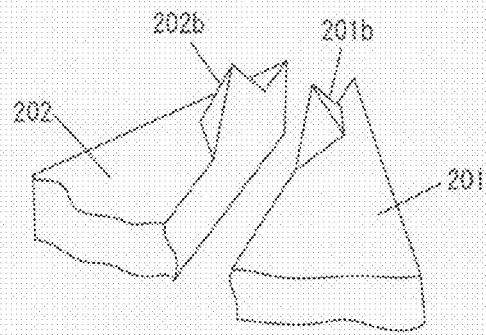
(c)

FIG.30
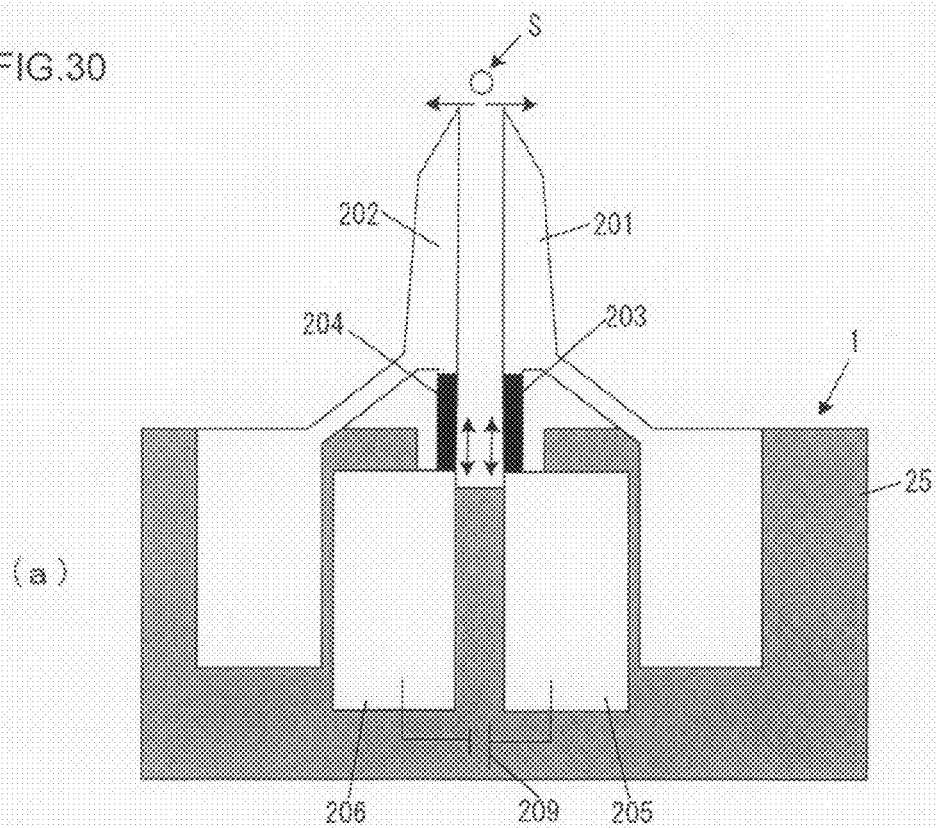
(a)
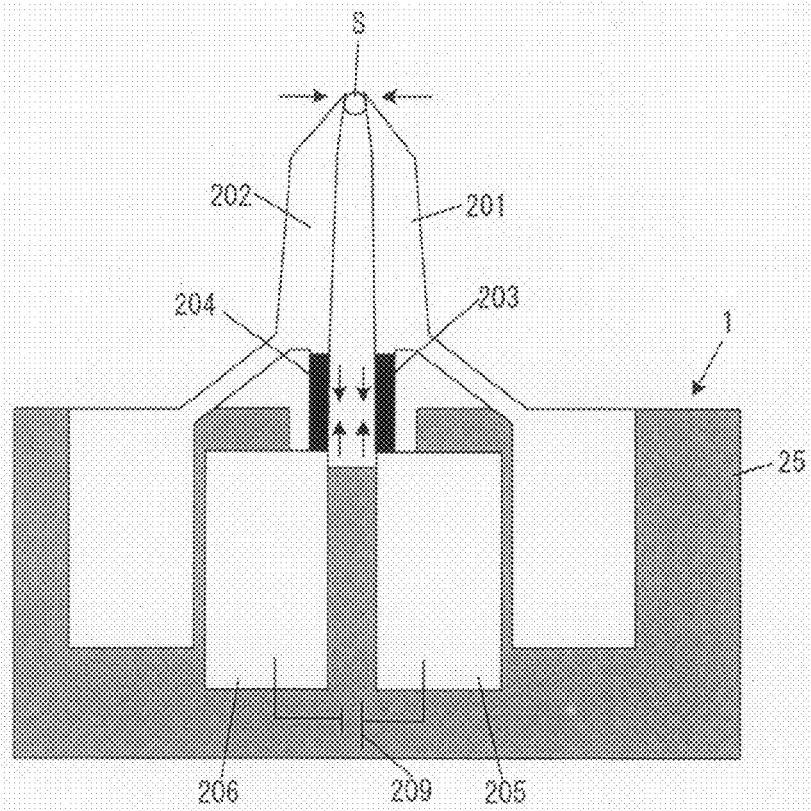
(b)

FIG.31
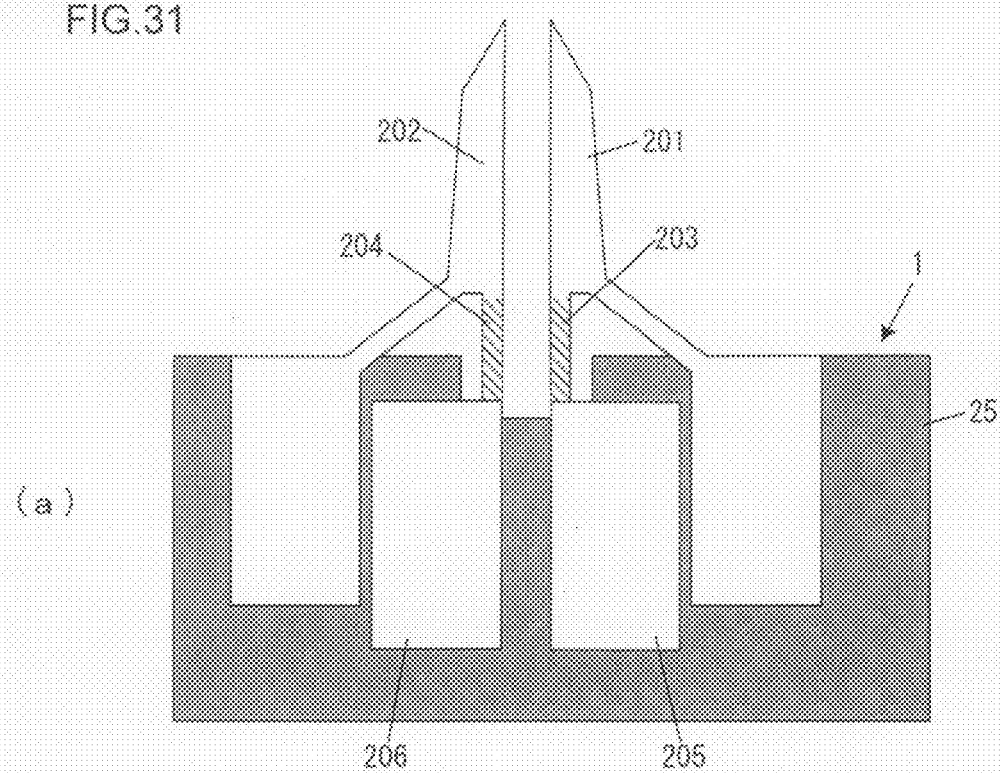
(a)
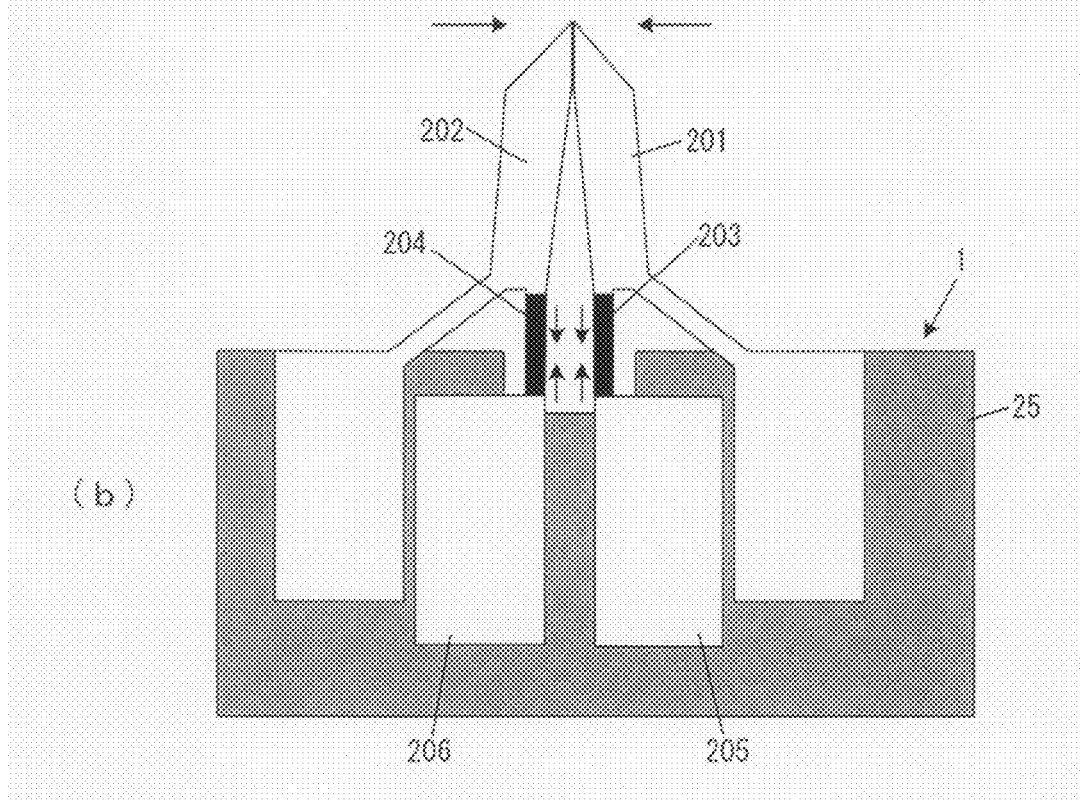
(b)

NANOTWEEZER AND SCANNING PROBE MICROSCOPE EQUIPPED WITH NANOTWEEZER

TECHNICAL FIELD

The present invention relates to a nanotweezer used to observe the surface of a specimen and hold a minuscule object and a scanning probe microscope equipped with the nanotweezer.

BACKGROUND ART

In a scanning probe microscope (SPM), a probe at a cantilever is positioned in the vicinity of specimen, over a very small distance down to the atomic-diameter order and the probe is then used to two-dimensionally scan the surface of the specimen. A force attributable to, for instance, the interaction of the specimen and the probe is detected through this process, and recessions, projections or the like present at the specimen surface are observed based upon the detected force. A nanotweezer holds a minuscule object in a nano order size as its front end is opened and closed. There are nanotweezers known in the related art that have both the observation function and the holding function described above (see, for instance, patent reference literature 1). In the device disclosed in the patent reference literature, two carbon nano tubes are fixed onto the front end of the cantilever of an atomic force microscope, one of the carbon nano tubes is used to observe a minuscule object and the minuscule specimen is grasped and released as the front ends of two carbon nano tubes are made to open/close with electrostatic force or the like.

Patent reference 1: U.S. Pat. No. 4,927,254

DISCLOSURE OF THE INVENTION

Problems to be Solved by the Invention

However, in addition to the standard manufacturing steps followed while manufacturing nanotweezers in the related art, an additional, difficult manufacturing step for fixing the two carbon nano tubes to the front end of the cantilever must be performed to manufacture the nanotweezer disclosed in patent reference 1.

Means for Solving the Problems

A nanotweezer according to the 1st aspect of the present invention comprises: a supporting member; an observation probe that projects out from the supporting member, and is used when observing a surface of a specimen; a movable arm that is arranged next to the observation probe projecting out from the supporting member, and makes closed or opened between the observation probe and the movable arm to hold or release the specimen held between the observation probe and the movable arm; and a drive mechanism that drives the movable arm so as to make closed or opened between the observation probe and the movable arm, and the supporting member, the observation probe and the movable arm are each formed by processing a semiconductor wafer through a photolithography process.

A nanotweezer according to the 2nd aspect of the present invention comprises: a supporting member; an observation probe that extends from the supporting member along a specific direction, and includes a probe portion used in specimen surface observation and a first holding portion used to hold a specimen; a movable arm that extends from the supporting member along the specific direction, is arranged next to the observation probe, and includes a second holding portion facing to the first holding portion along the specific direction; and a drive mechanism that drives the movable arm along the direction in which the movable arm extends so as to hold the specimen between the first holding portion and the second holding portion, and the supporting member, the observation probe and the movable arm are each formed by processing a semiconductor wafer through a photolithography process.

It is acceptable that: the first holding portion is a projection projecting out from the observation probe toward the specimen surface and includes a first holding surface ranging perpendicular to the specific direction and the probe portion formed at a front end of the projection; and the second holding portion includes a second holding surface used to hold the specimen between the first holding surface and the second holding surface. And it is also acceptable that the first holding surface and the second holding surface are formed so as to range perpendicular to the specific direction.

It is acceptable that: the semiconductor wafer is an SOI wafer that includes an $SiO_2$ layer sandwiched between a pair of Si layers; the observation probe and the movable arm are formed side-by-side over a specific distance from each other at one of the pair of Si layers; and the first holding portion, the second holding portion and the probe portion are each formed so as to project out along a direction in which the observation probe and the movable arm are arranged side-by-side. And it is acceptable too that the first holding portion, the second holding portion and the probe portion are each formed so as to project out along a direction extending perpendicular to a direction in which the observation probe and the movable arm are arranged side-by-side.

Also, it is acceptable that: the observation probe is constituted with a beam of a horseshoe-shaped member with a slit space formed to extend along the specific direction; and the movable arm is arranged so as to be allowed to slide freely along the specific direction within the slit space.

Moreover, it is acceptable that the drive mechanism drives the movable arm through thermal deformation caused by heat generated with supplied electric power.

A scanning probe microscope according to the 3rd aspect of the present invention, comprises: any one of nanotweezers described above; a detection unit that detects a displacement attributable to an interaction between the observation probe and the specimen surface; a control unit that controls a drive operation of the drive mechanism; an arithmetic operation unit that determines through arithmetic operation a physical and/or chemical state at the specimen surface based upon the displacement detected by the detection unit; and a scanning means for engaging the observation probe in scanning movement relative to the specimen surface. There may be further provided a display unit that provides a visual display of results of the arithmetic operation executed by the arithmetic operation unit.

Also, it is acceptable that: the detection unit includes a light source that radiates light onto the observation probe and a light receiving unit that detects light reflected from the observation probe; and the arithmetic operation unit determines through arithmetic operation a surface contour of the specimen based upon a detection signal provided by the light receiving unit.

Furthermore, it is acceptable that: there is further provided an exciter unit that causes the observation probe to vibrate in a direction to the specimen with a resonance frequency selected for the observation probe in order to enable observation of the specimen in a tapping mode; and the movable arm is formed to have a resonance frequency set at a value different from the resonance frequency of the observation probe.

A method for manufacturing the nanotweezer described above according to the 4th aspect of the present invention, comprises: using the semiconductor wafer constituted with an SOI wafer; a step of forming two projecting strips to define basic shapes of the observation probe and the movable arm by partially removing one of silicon layers in the SOI wafer; a step of forming a pointed portion to come into close proximity to or contact with the specimen at a front end of a projecting strip to define a basic shape of the observation probe; and a step of forming the observation probe and the movable arm with the two projecting strips by partially removing another silicon layer and a silicon oxide layer in the SOI wafer and also forming the supporting member with a portion remaining unremoved.

A nanotweezer according to the 5th aspect of the present invention, comprises: a supporting member; a pair of arms that are arranged side-by-side extending from the supporting member with holding portions used to hold a specimen each formed at one of the pair of arms; a probe portion that is used for specimen surface observation and is formed at least one of the pair of arms; a force-applying mechanism that applies a force to the pair of arms so as to move the arms toward each other until the holding portions at the pair of arms come in contact with each other; and a drive mechanism that drives the pair of arms so as to move the pair of arms away from each other against the force applied by the force-applying mechanism.

It is acceptable that the supporting member, the pair of arms, the force-applying mechanism and the drive mechanism are each formed by processing a semiconductor wafer through a photolithography method.

It is also acceptable that: there is further provided a thermal actuator that functions both as the force-applying mechanism and the drive mechanism; and the thermal actuator is a member formed by doping the Si layer with boron and then annealing the Si layer doped with boron and includes an electrode to which electric power is supplied.

A method for manufacturing a nanotweezer according to the 6th aspect of the present invention, comprises: using the semiconductor wafer constituted with an SOI wafer that includes an $SiO_2$ layer sandwiched between a pair of Si layers; a first step of forming the pair of arms, the force-applying mechanism and the drive mechanism by etching one of the Si layers in the SOI wafer; a second step of doping boron onto the Si layer constituting the force-applying mechanism; and a third step of creating at the force-applying mechanism contraction stress to be used to drive the pair of arms along a closing direction by annealing the Si layer doped with boron.

It is acceptable that: in the first step, the pair of arms are formed side-by-side over a specific distance from each other; and in the third step, the pair of arms are set in a closed state by creating the contraction stress at the force-applying mechanism.

A scanning probe microscope, according to the 7th aspect of the present invention, comprises: the nanotweezer described above; a detection unit that detects a displacement attributable to an interaction between the arms and the specimen surface; a control unit that controls a drive operation of the drive mechanism; an arithmetic operation unit that determines through arithmetic operation a physical and/or chemical state at the specimen surface based upon the displacement detected by the detection unit; and a scanning means for engaging a front end of the arm in scanning movement relative to the specimen surface.

There may be provided a display unit that provides a visual display of results of the arithmetic operation executed by the arithmetic operation unit.

Effect of the Invention

According to the present invention, the elements constituting the nanotweezer, such as the supporting member, the observation probe, the movable arm and the holding arm, are formed through photolithography by using a semiconductor wafer as a base material and, as a result, a high level of dimensional accuracy is achieved to enable accurate observation of the specimen while firmly holding the specimen. In addition, compared to a nanotweezer in the related art that includes carbon nano tubes fixed therein, the nanotweezer according to the present invention can be manufactured at lower cost. Furthermore, since the specimen is held with two holding portions by linearly moving the holding portion of the movable arm toward the holding portion of the observation probe, a firm hold is achieved with ease.

BRIEF DESCRIPTION OF THE DRAWINGS

FIG. 7 Step d illustrated in ($a$) and ($b$)

FIG. 10 Step e illustrated in ($a$) presenting a sectional view taken along I-I and ($b$) presenting a sectional view taken along II-II FIG. 11 Step f illustrated in ($a$) presenting a sectional view taken along I-I and ($b$) presenting a sectional view taken along II-II FIG. 12 A perspective of the wafer 30 having undergone the processing in step f FIG. 13 Step g illustrated in ($a1$) and ($a2$) and step h illustrated in ($b1$)

FIG. 17 The observation operation illustrated in ($a$) and the holding operation illustrated in ($b$) and ($c$)

FIG. 20 Step g illustrated in (a1) and (a2), step h illustrated in (b1) and (b2) and step i illustrated in (c1)~(c3)

FIG. 29 A fourth embodiment illustrated in (a) presenting a plan view of the nanotweezer 1 taken from the specimen surface side and (b) and (c) presenting enlargements of the structure assumed at the front end portion R of the nanotweezer 1

FIG. 30 The holding operation executed with the arms 201 and 202 to hold the specimen S, with (a) illustrating an open state and (b) illustrating a closed state FIG. 31 The nanotweezer 1 separated from the SOI wafer shown in (a) and the nanotweezer having undergone the annealing process shown in (b)

BEST MODE FOR CARRYING OUT THE INVENTION

The following is an explanation of the embodiments of the present invention, given in reference to the drawings.

First Embodiment

Figure 1:
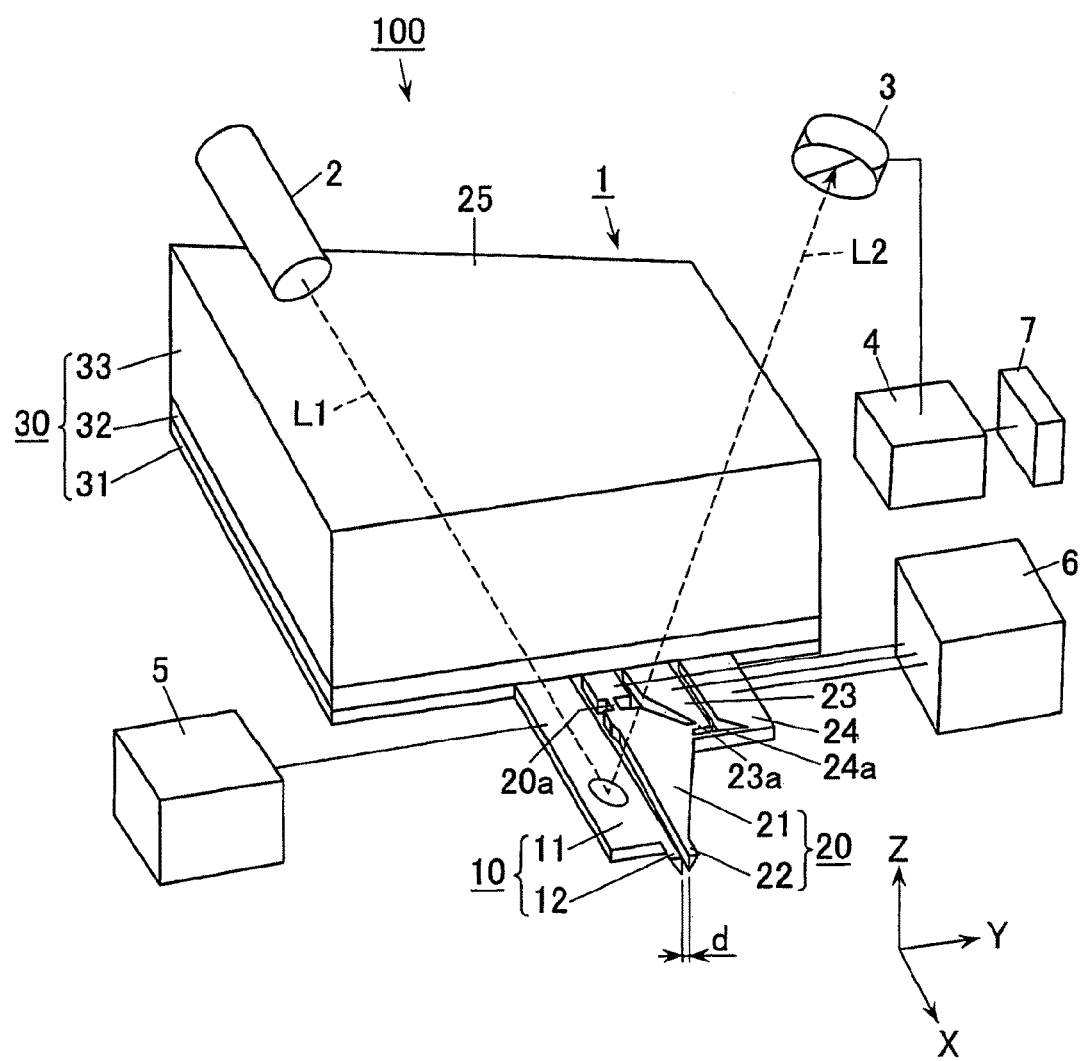
FIG. 1 A first embodiment of the scanning probe microscope according to the present invention FIG. 2 Essential structural elements of the nanotweezer 1, with ($a$) showing the observation probe 10 and the movable arm 20 and ($b$) showing the probe portion of the observation probe 10

FIG. 1 schematically shows the structure adopted in an atomic force microscope system (hereafter referred to as an AFM system) embodying the scanning probe microscope according to the present invention as the first embodiment thereof. FIG. 2 shows the essential structural elements constituting a nanotweezer (a nano pincette) 1 installed in the AFM system 100 in FIG. 1 (a pair of nanotweezers is referred to as a nanotweezer), with (a) showing an observation probe 10 and a movable arm 20 and (b) showing the probe portion of the observation probe 10.

As shown in FIG. 1, the AFM system 100 comprises the nanotweezer 1, a laser light source 2, a two-element split photodiode 3, an arithmetic operation unit 4, an exciter unit 5 and a power supply unit 6. The nanotweezer 1, which includes the observation probe 10 and the movable arm 20 formed so as to constitute an integrated unit together with a supporting member 25, is formed by processing an SOI wafer through photolithography, as detailed later.

The observation probe 10 includes a lever 11 extending along the X direction in the figure and a probe portion 12 extending from the front end of the lever 11 along the X direction. The movable arm 20 arranged or disposed next to the observation probe 10 includes a lever 21 extending along the X direction and a holding portion 22 extending from the front end of the lever 21 along the X direction. The probe portion 12 and the holding portion 22 extending substantially parallel to each other are set over a distance d from each other. Drive levers 23 and 24, provided as integrated parts of the supporting member 25, function as a thermal actuator that drives the movable arm 20. Ends of the drive levers 23 and 24 are connected to the movable arm 20, thereby forming a link mechanism. Power is supplied from the power supply unit 6 to the drive levers 23 and 24 functioning as a thermal actuator.

The supporting member 25 is detachably held by a holder (not shown) located at the AFM system 100. It is to be noted that only part of supporting member 25 is shown in FIG. 1. Although not shown, the AFM system 100 includes a three-dimensional stage to which the holder used to hold the supporting member 25 is fixed. As the three-dimensional stage is driven, the entire nanotweezer 1 can be displaced along directions in three dimensions. The supporting member 25 may be attached to the holder, by adopting any of various methods, e.g., sliding and fitting the supporting member 25 into a groove or a recess formed at the holder or clamping the supporting member 25 with a plate spring disposed at the holder.

A detection signal provided by the two-element split photo diode 3 is input to the arithmetic operation unit 4. Based upon the detection signal input thereto, the arithmetic operation unit 4 calculates the amplitude of the observation probe 10 and determines the contour of the surface of a specimen S through arithmetic operation. The arithmetic operation results are indicated at a monitor 7. The exciter unit 5 includes a piezoelectric element (not shown) that induces resonance at the observation probe 10 by vibrating the entire nanotweezer 1 and a drive circuit engaged in drive of the piezoelectric element.

As shown in FIG. 2, the YZ sections of the lever 11 at the observation probe 10 and the lever 21 at the movable arm 20 are rectangular, the levers 11 and 21 assume lengths measured along the X direction equal to each other and thicknesses measured along the Z direction equal to each other, and the lever 11 assumes a greater width taken along the Y direction compared to the width of the lever 21. In addition, the probe portion 12 of the observation probe 10 and the holding portion 22 of the movable arm 20 assume dimensions equal to each other along their lengths measured in the X direction, their widths measured in the Y direction and their heights measured in the Z direction. The probe portion 12 and the holding portion 22 each assume a wedge shape tapering off along the −Z-direction, and they both have a right-angle triangle section taken along the YZ plane. The sections of the probe portion 12 and the holding portion 22, disposed over the distance d, are symmetrical relative to the Z axis. Surfaces 12a and 22a (hereafter referred to as perpendicular surfaces) of the probe portion 12 and the holding portion 22, facing opposite each other, range parallel to each other. A ridgeline 12c, at which the perpendicular surface 12a and a sloping surface 12b of the probe portion 12 connect with each other, and a ridgeline 22c at which the perpendicular surface 22a and a sloping surface 22b of the holding portion 22 connect with each other, extend parallel to the X axis, and the probe portion and the holding portion function as the sharp ends (blade ends) that approach or contact the specimen S.

The method adopted when observing the specimen is now explained in reference to FIGS. 1 and 2. In the embodiment, the contour of the surface of the specimen S is determined through measurement by driving the piezoelectric element (not shown) disposed at the exciter unit 5, thereby inducing a flexural vibration of the observation probe 10 along the direction (the Z direction) indicated by the arrow V in FIG. 2 and, at the same time, scanning the nanotweezer 1 along the XY direction. This method is generally referred to as a tapping mode. During the observation process, the probe portion 12 of the observation probe 10 is moved very close to the specimen surface so as to position it over a very small distance down to the atomic diameter order, and the specimen surface is scanned two-dimensionally while inducing vibration at the observation probe along the Z direction. As the specimen surface with recessions and projections is scanned and thus the distance between the front end of probe portion 12 and the specimen S (the average distance between the front end of the vibrating probe portion 12 and the specimen S) changes, the amplitude at the lever 11 also changes due to the change occurring in the interaction between the specimen surface and the probe portion 12. The extent of the change in the amplitude is measured through an optical lever measurement method which utilizes the laser light source 2 and the two-element split photodiode.

In the optical lever measurement method, laser light L1 originating from the laser light source 2 is directed onto the upper surface of the lever 11, and reflected light L2 from the upper surface of the lever 11 is received at the two-element split photodiode 3 functioning as a light receiving unit. The two-element split photodiode 3 outputs a detection signal corresponding to the light reception position to the arithmetic operation unit 4. Based upon the detection signal provided by the two-element split photodiode 3, the arithmetic operation unit 4 calculates the extent of change having occurred in the amplitude of the lever 11 and also determines through arithmetic operation the contours at the surface of the specimen S based upon the extent in the amplitude change. The surface contour thus determined is then displayed at the monitor 7.

During the observation conducted in the tapping mode described above, it is necessary to induce resonance at the observation probe 10 by vibrating the entire supporting member 25 along the Z direction via the piezoelectric element. Accordingly, the width of the lever 11 at the observation probe 10 is set larger than the width of the lever 21 at the movable arm 20, as explained earlier, so as to ensure that the resonance frequency of the vibration along the thickness of the vibration probe 10 is higher than the resonance frequency of the movable arm 20. As the exciter unit 5 vibrates the entire supporting member 25 with the resonance frequency set for the observation probe 10, the observation probe 10 alone resonates and vibrates along the Z direction.

Figure 3:
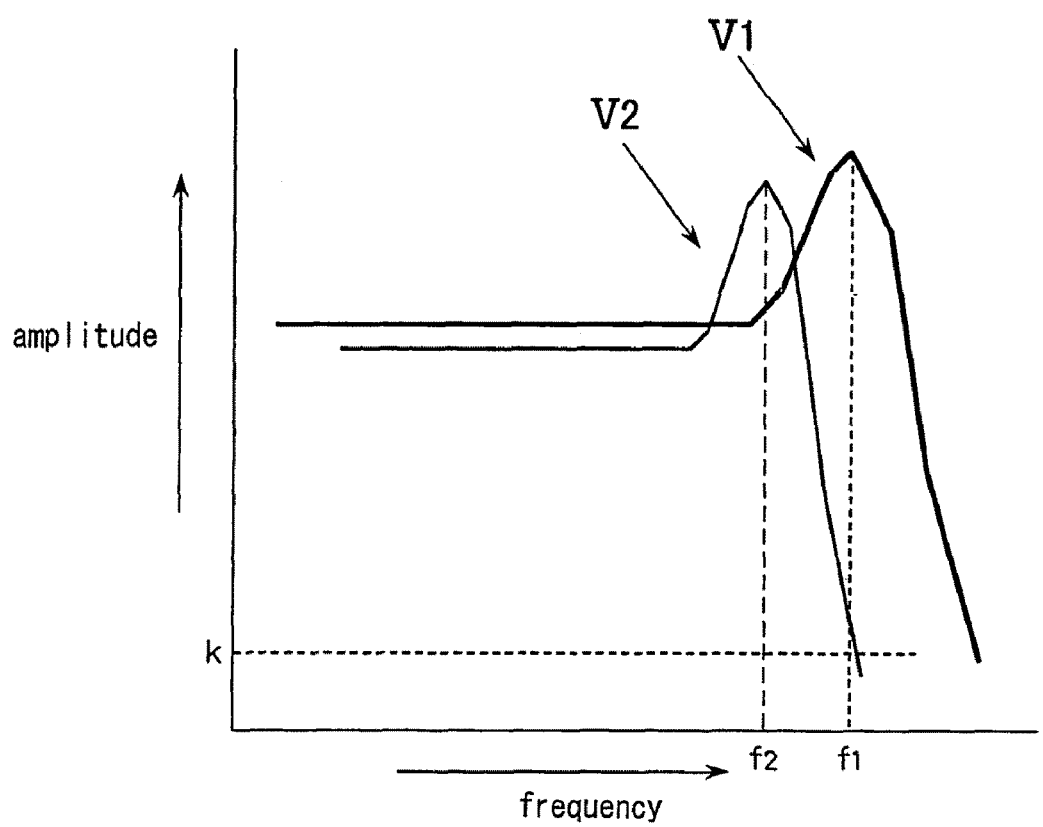
FIG. 3 The resonance frequency of the observation probe

FIG. 3 provides a diagram of the resonance frequency at the observation probe 10, with the amplitude indicated along the vertical axis and the frequency indicated along the horizontal axis. V1 in FIG. 3 indicates the vibration curve of the observation probe 10 and V2 in FIG. 3 indicates the vibration curve of the movable arm 20. When the frequency of the vibration induced via the exciter unit 5 is f1, a resonance occurs in the observation probe 10 and the amplitude peaks. This frequency f1 is the resonance frequency of the observation probe 10. The resonance frequency of the movable arm 20 is f2 and the vibration peak manifests at the frequency f2. Once the frequency exceeds f2, the amplitude rapidly decreases and the amplitude k of the movable arm 20 at the frequency f1 is much smaller than the amplitude at the observation probe 10. By setting the widths of the levers 11 and 21 so that the resonance frequency f1 of the observation probe 10 is higher than the resonance frequency f2 of the movable arm 20, it is possible to cause the observation probe 10 alone to vibrate.

Alternatively, the desirable resonance frequencies may be selected by adjusting the thicknesses of the levers 11 and 21 instead of selecting the desirable resonance frequencies through the adjustment of the widths of the levers 11 and 21. In this case, the lever 11 of the observation probe 10 should assume a greater thickness than the thickness of the lever 21 at the movable arm 20. Since the resonance frequency is represented by the value obtained by cubing the corresponding thickness, the resonance frequency can be adjusted to a significant extent simply by slightly altering the thickness.

Figure 4:
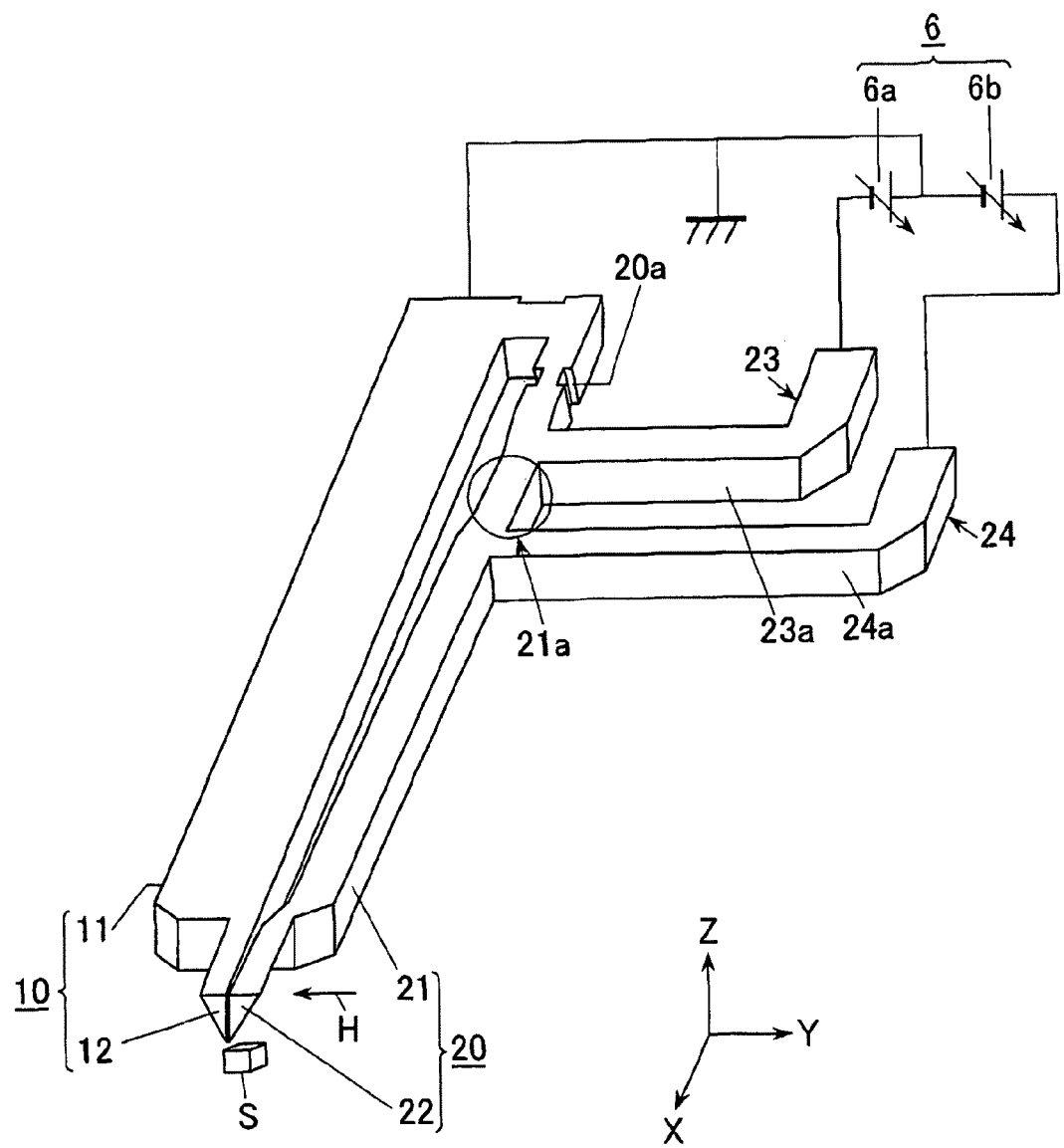
FIG. 4 The observation probe 10, the movable arm 20, the drive levers 23 and 24 and the power supply unit 6 shown in an enlargement FIG. 5 Step a illustrated in ($a1$) and ($a2$), step b illustrated in ($b1$) and ($b2$) and step c illustrated in ($c1$) and ($c2$)

Next, in reference to FIGS. 1 and 4, the thermal actuator that drives the movable arm 20 is explained. FIG. 4 presents a schematic enlargement of the observation probe 10, the movable arm 20, the drive levers 23 and 24 and the power supply unit 6 in FIG. 1. The thermal actuator is constituted with the drive levers 23 and 24 and the power supply unit 6. A beam portion 23a of the drive lever 23 and a beam portion 24a of the drive lever 24 are both connected to the movable arm 20. While the beam portions 23a and 24a assume thicknesses equal to each other measured along the Z direction, the width, measured along the X direction of the beam portion 24a, is set smaller than the width of the beam portion 23a. The power supply unit 6 includes two variable power sources 6a and 6b connected in series, with the negative pole of the variable power source 6a connected to the drive lever 23 and the positive pole of the variable power source 6b connected to the drive lever 24. The potential at the connecting point at which the variable power source 6a and the variable power source 6b are connected and the potential at the movable arm 20 are both set to the ground potential.

As described earlier, the width of the beam portion 24a measured along the X direction is set smaller than that of the beam portion 23a and thus, the resistance value at the beam portion 24a with a smaller sectional area is greater than the resistance value at the beam portion 23a. For this reason, as power is supplied from the power supply unit 6 to the beam portions 23a and 24a, a greater quantity of Joule heat is generated at the beam portion 24a than at the beam portion 23a and the beam portion 24a thermally expands to a greater extent than the beam portion 23a. As a result, the movable arm 20 is caused to flex along an H direction extending parallel to the Y axis via the drive levers 23 and 24 with the fulcrum assumed at a narrow portion 20a where the width of the movable arm 20 becomes narrow. The extent of flexure of the movable arm 20 is adjusted through feedback control of the voltage applied from the power supply unit 6 to the beam portions 23a and 24a. It is to be noted that the voltage at the variable power sources 6a and 6b are adjusted so as to set the potential over an area 21a of the movable arm 20 at ground level.

By adjusting the potential at the area 21a of the movable arm 22 to ground level as described above, the potentials at both the observation probe 20 and the movable arm 10 can also be controlled at ground level, preventing the application of any unnecessary voltage to the specimen S being held.

The specimen is grasped and held with the nanotweezer 1 equipped with such a thermal actuator mechanism through the following operation. First, the specimen S to be held by the nanotweezer 1 is located by three-dimensionally displacing the nanotweezer 1 along the surface of the specimen and observing the contour of the specimen surface with the observation probe 10. Once the specimen S is detected, the nanotweezer 1 is moved so that the specimen S is positioned between the probe portion 12 and the holding portion 22. After stopping the tapping operation of the observation probe 10, the drive levers 23 and 24 are driven and the movable arm 20 is flexed along the H direction in the figure so as to move the holding portion 22 closer to the probe portion 12 until the specimen S becomes clamped between the holding portion 22 and the probe portion 12. During this process, the movable arm 20 alone is caused to flex by the drive levers 23 and 24, while the observation probe 10 remains stationary.

To explain the holding procedure in more specific terms, the perpendicular surface 12a (see FIG. 2(b)) of the probe portion 12 at the observation probe 10 is first set in contact with the specimen S. Next, the movable arm 20 is flexed so as to move the perpendicular surface 22a (see FIG. 2(b)) of the holding portion 22 closer to the specimen S and the variable power sources 6a and 6b are adjusted so as to set the perpendicular surface 22a in contact with the specimen S with an optimal level of pressure. As a result, the specimen S is by the nanotweezer 1.

Since the perpendicular surfaces 12a and 22a are formed so as to range parallel to each other and face opposite each other, the specimen S is firmly held between the parallel surfaces 12a and 22a. Once the specimen S is held, the specimen S can be made to move three-dimensionally by driving the three-dimensional stage. In addition, the specimen S currently held can be released simply by reducing the voltage applied from the power supply unit 6 to zero and thus resetting the distance between the holding portion 22 and the probe portion 12 to the initial distance d. Through this operation, the specimen S can be held and, at the same time, observed via the nanotweezer 1 equipped with the observation probe 10 and the movable arm 20.

Next, a method that may be adopted when manufacturing the nanotweezer 1 achieved in the embodiment is explained. The nanotweezer 1 is manufactured as an integrated unit constituted with an SOI (silicone on insulator) wafer. An SOI wafer is manufactured by pasting together two Si single-crystal plates so as to sandwich an $SiO_2$ layer formed at one of the Si single-crystal plates. As shown in FIG. 1, the supporting member 25 includes an upper Si layer 31, an $SiO_2$ layer 32 and a lower Si layer 33 constituting the SOI wafer. Except for the electrodes and the like used to connect with the power supply unit 6, the observation probe 10, the movable arm 20 and the drive levers 23 and 24 are all constituted with the upper Si layer 31. While the thicknesses of the layers 31, 32 and 33 constituting the SOI wafer used in the embodiment are 6 um, 1 um and 300 um respectively, the present invention is not limited to this dimensional combination.

FIGS. 5~14 show the manufacturing steps (processes) through which the nanotweezer 1 achieved in the embodiment is manufactured as steps a through h are executed in sequence. FIGS. 5(a1) and 5(a2) illustrate step a, with (a1) presenting a perspective and (a2) presenting a sectional view. In step a, a silicon nitride (SiN) film 34 is formed over a 50 nm thickness atop the upper Si layer 31 of an SOI wafer 30 constituted with the upper Si layer 31, the $SiO_2$ layer 32 and the lower Si layer 33. It is to be noted that the upper Si layer 31 of the SOI wafer 30 is formed so as to set the basal plane (001) of the Si single-crystal at the surface of the upper Si layer 31.

In FIGS. 5(b1) and 5(b2), step b is illustrated with (b1) presenting a perspective and (b2) presenting a sectional view taken along I-I. In step b, the SiN film 34 is partially etched and removed with $C_2F_6$ through RIE executed by using a mask A shown in FIG. 6, until the upper Si layer 31 becomes partially exposed (over unhatched areas A1 and A2). The area A1 from which the SiN film 34 is removed through etching is substantially an area where the front end of the observation probe 10 and the front end of the movable arm 20 are to be formed. Over the area A2, the base end sides of the observation probe 10 and the movable arm 20 and the drive levers 23 and 24 are formed. The direction along which the observation probe 10 and the movable arm 20 are to extend, i.e., the direction along which the narrow strip A extends, should be aligned with the <110> direction of the upper Si layer 31.

Figure 6:
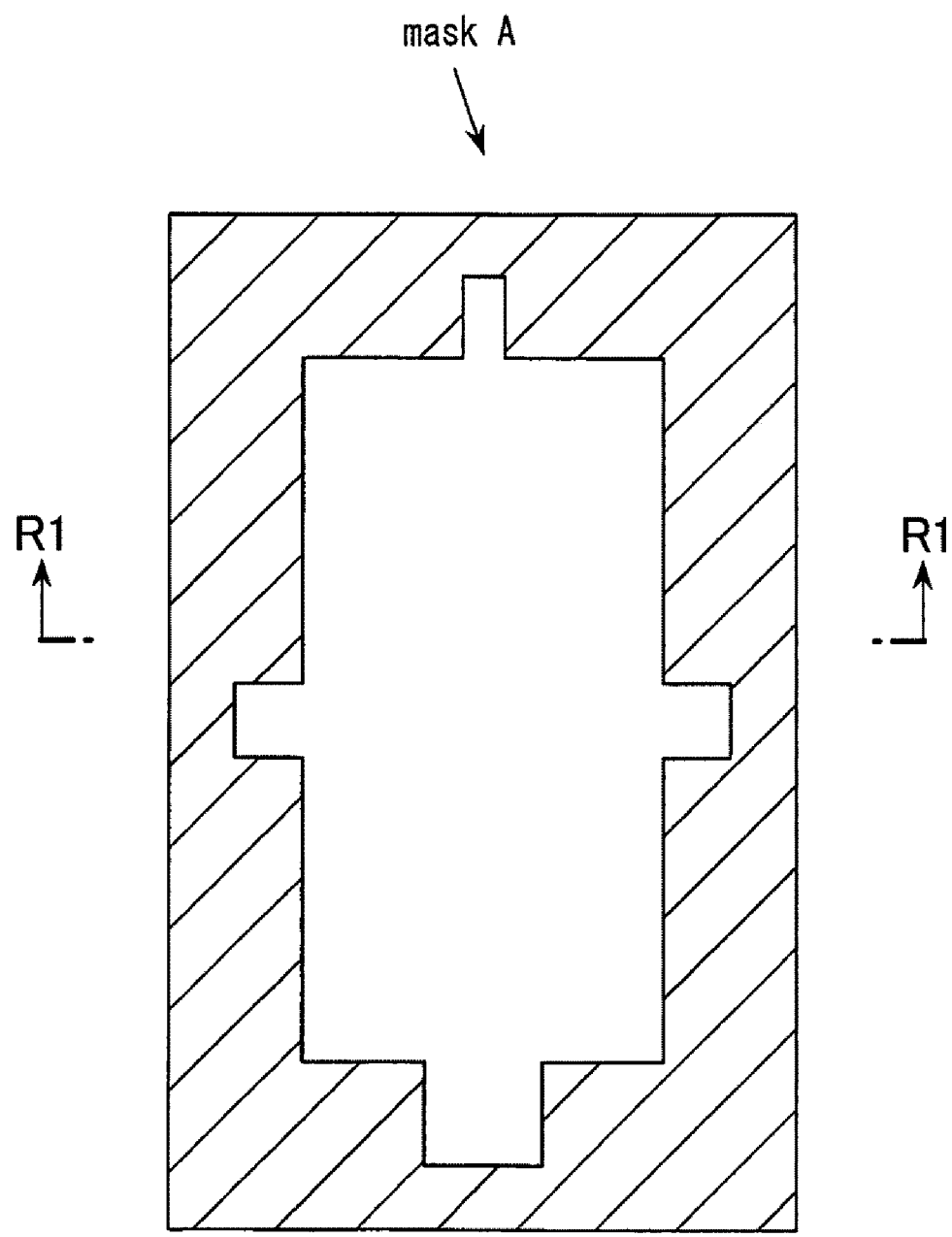
FIG. 6 A plan view of the mask A

It is to be noted that the mask A shown in FIG. 6 also covers the supporting member 25, and that the portion of the mask above line R1-R1 in FIG. 6 is relevant to the illustrations presented in FIG. 1 and FIG. 5(b1). Accordingly, the following explanation is provided with regard to the area above line R1-R1.

In step c shown in FIGS. 5(c1) and 5(c2), an oxide film 35 is formed over a thickness of 0.1 um at the surface of the upper Si layer 31 over the areas A1 and A2. The exposed surface of the upper Si layer 31 is oxidized through steam oxidation with steam generated by inducing a reaction of an oxygen gas and a hydrogen gas at high temperature.

Figure 9:
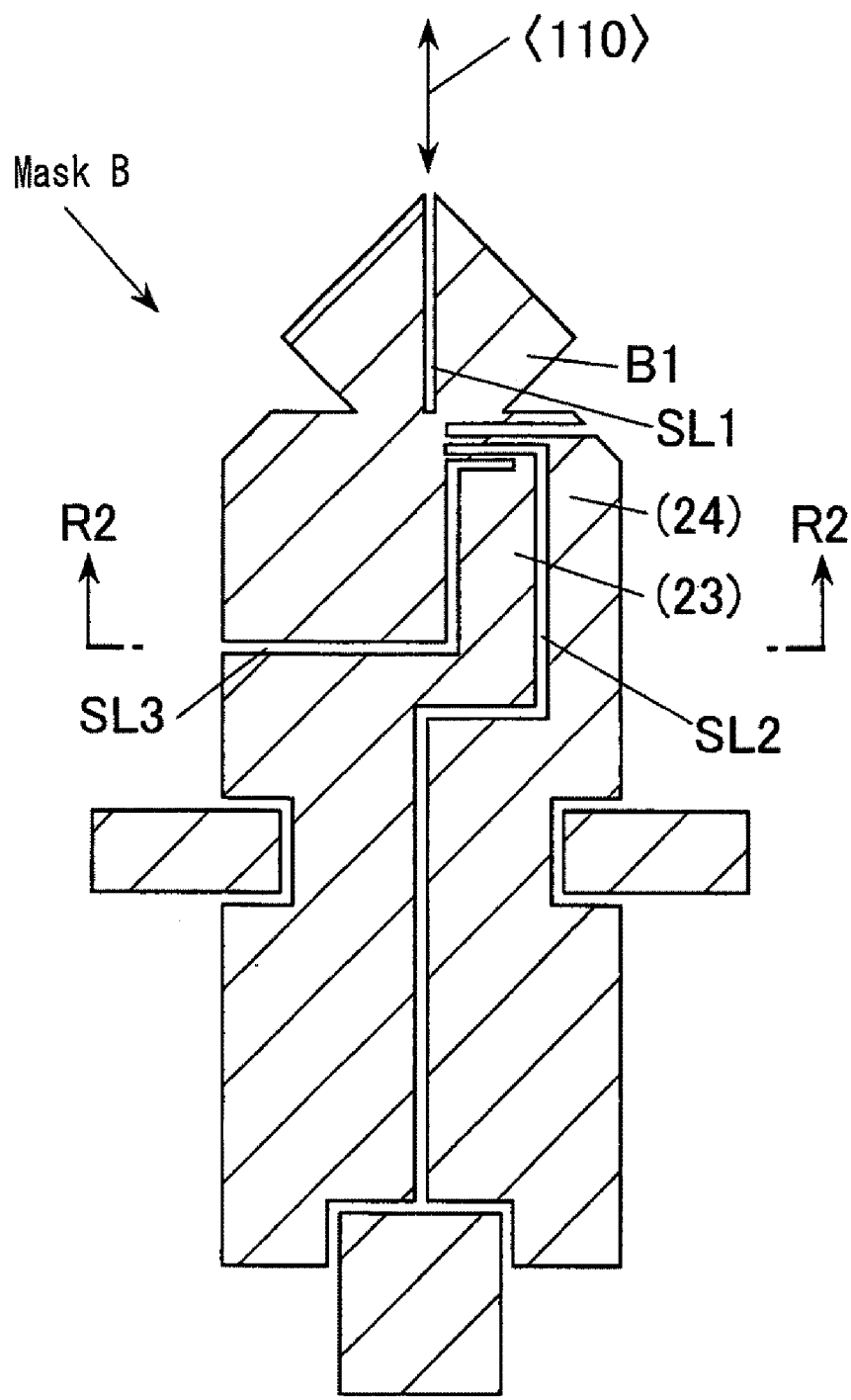
FIG. 9 A plan view of the mask B

FIGS. 7(a) and 7(b) illustrate step d. In step d, an etching process is executed through ICP-RIE, (inductively coupled plasma-reactive ion etching) by using a mask B shown in FIG. 9. As shown in FIG. 9, the mask B includes a front end shielding area B1 to shield the area A1 in FIG. 7(c1). A slit SL1, extending along the up/down direction in the figure (along the <110> direction of the upper Si layer 31), is formed at the front end shielding area B1. In addition, slits SL2 and SL3 are used when forming the drive levers 23 and 24. It is to be noted that the portion of the mask B above line R2-R2 in FIG. 9 corresponds to the portion shown in FIGS. 7(a) and 7(b).

The dotted lines in FIG. 7(a) indicate the mask B disposed atop the wafer 30, having undergone the processing shown in FIG. 5(c1). The area that is not covered with the mask B in FIG. 7(a) is etched through ICP-RIE until the $SiO_2$ layer 32 becomes exposed. Since this etching process executed through ICP-RIE stops at the $SiO_2$ layer 32, the observation probe 10 and the movable arm 20 with a uniform thickness can be formed with a high level of accuracy.

FIG. 7(b) shows the wafer 30 having undergone the etching process. By etching the area over the slit SL1 at the mask B, a slit groove 40 extending along the <110> direction has been formed. The two side surfaces of the slit groove 40 range perpendicular to the surface of the SiN film 34 and the depth of the slit groove 40 is equal to the sum of the thicknesses of the SiN film 34 and the upper Si layer 31. The two side surfaces of the slit groove 40 eventually become the perpendicular surface 12a of the probe portion 12 and the perpendicular surface 22a of the holding portion 22 (see FIG. 2) in the finished nanotweezer product 1.

Figure 8:
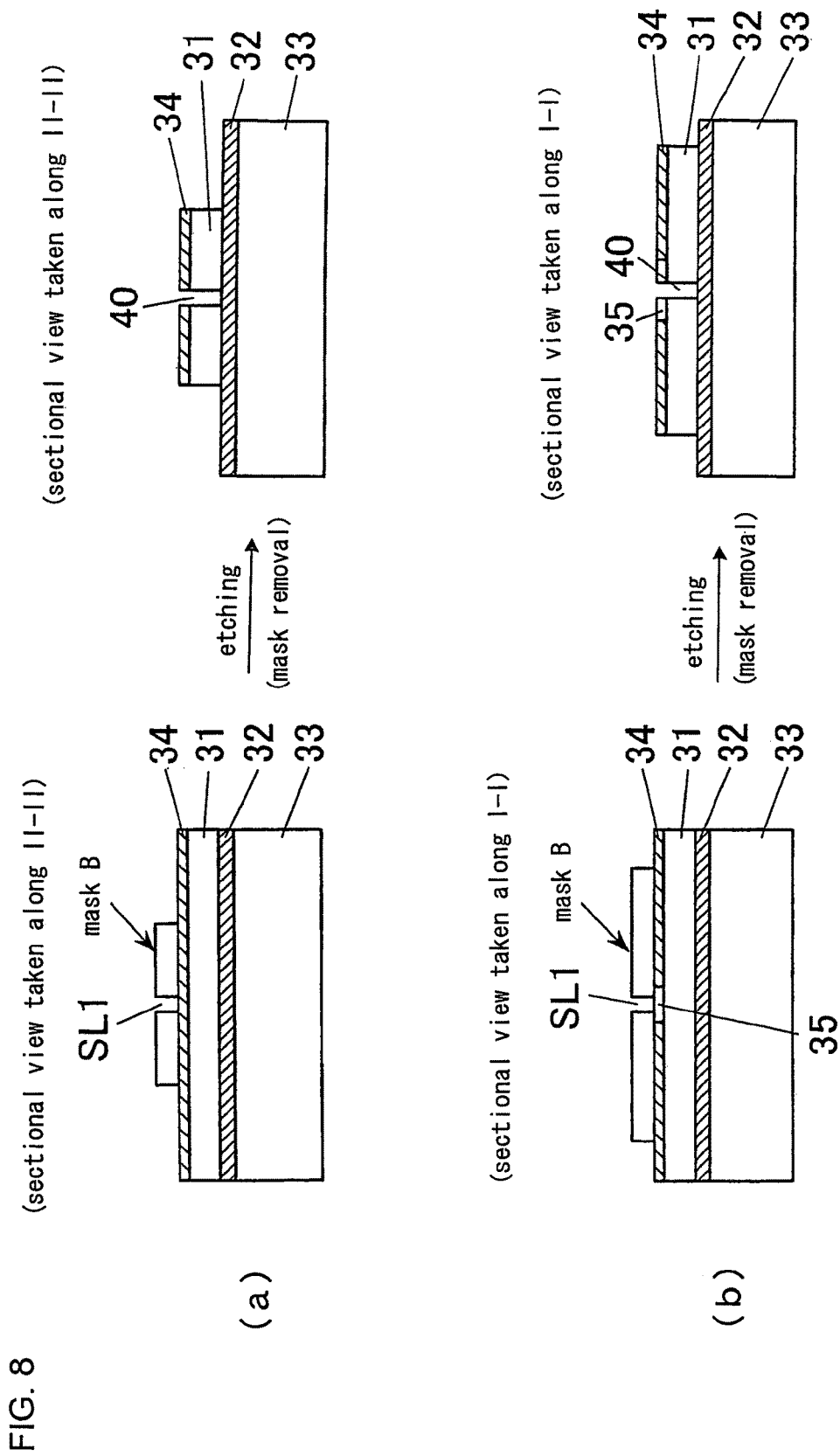
FIG. 8 Sectional views of the wafer 30 before and after the etching process executed in step d, with ($a$) presenting sectional views taken along II-II in FIGS. 7 and ($b$) presenting sectional views taken along I-I in FIG. 7

FIG. 8 presents sectional views of the wafer 30 taken before and after the etching process, with (a) presenting sectional views taken along II-II in FIGS. 7 and (b) presenting sectional views taken along I-I in FIG. 7. Over the areas not covered with the mask B, the silicon nitride (SiN) film 34, the oxide film 35 and the Si layer 31 are etched. As a result, the upper surface of the $SiO_2$ layer 32 and the side surfaces of the Si layer become exposed in the etched areas.

FIG. 10 illustrates step e with a sectional view similar to those taken along I-I in FIG. 7, presented in (a) and a sectional view similar to those taken along II-II that in FIG. 7 presented in (b). In step e, an oxide film 36 is formed for purposes of surface protection at the side surfaces of the upper Si layer 31 having become exposed through the etching process executed in step d. The oxide film is formed through steam oxidation as in step c.

Figure 12:
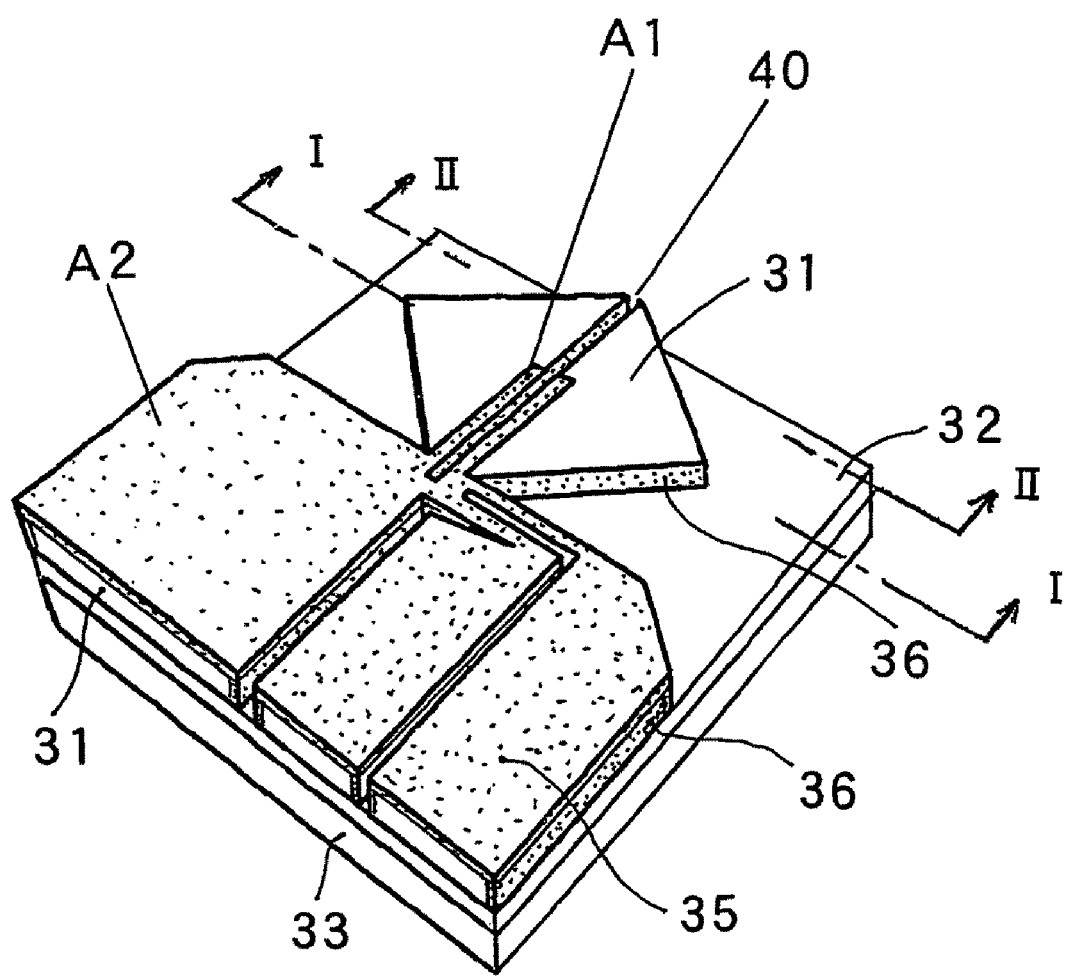

FIG. 11 illustrates step f, with a sectional view taken along I-I similar to that in FIG. 10(a) presented in (a) and a sectional view taken along II-II similar to that in FIG. 10(b) presented in (b). In step f, the SiN film 34 is removed through etching in an RIE process executed by using $C_2F_6$. As a result, the upper surface of the upper Si layer 31 becomes exposed as shown in FIGS. 11(a) and 11(b). While this RIE process is executed without using a mask, the pressure of the $C_2F_6$ gas is raised so as to achieve etching conditions under which the SiN film 34 is removed at an etching rate higher than the etching rate corresponding to the oxide films 35 and 36 and thus, the SiN film 34 alone is removed. This means that the oxide film 35 atop the upper Si layer 31 and the oxide film 36 at the side surfaces of the upper Si layer 31 remain unetched. FIG. 12 is a perspective of the processed wafer 30 with the oxide films 35 and 36 indicated as the areas hatched with dots.

In FIG. 13, step g is illustrated in (a1) and (a2) and step h is illustrated in (b1). FIG. 13(a2) is a sectional view taken along III-III in FIG. 13(a1). In step g, the upper Si layer 31 is an isotropically etched by using a 30% KOH aqueous solution. Since the upper surface of the upper Si layer 31 is exposed only over the areas where the oxide films 35 and 36 are not present, as shown in FIG. 11, the upper Si layer 31 is anisotropically etched starting at the exposed upper surface areas and sloping surfaces 11b, 21b, 12b and 22b are formed. As explained earlier, the basal plane (001) of the single-crystal Si is set at the surface of the upper Si layer 31 and thus, the {111} plane of the single-crystal Si is set at the sloping surfaces 12b and 22b formed through anisotropic etching.

It is to be noted that the thickness of the lever 11 at the observation probe 10 can be set greater than the thickness of the lever 21 at the movable arm 20 so as to achieve the desired resonance frequencies, as explained earlier, by protecting the area except for the area to be taken up by the lever 21 with a resist and thermally oxidizing or etching the area corresponding to the lever 21 to a predetermined depth.

Next, an ICP-RIE process is executed along the thickness-wise direction by using a mask C shown in FIG. 14(a) so as to remove through etching the upper Si layer 31 remaining over the area around the area where the basic shapes of the observation probe 10 and the movable arm 20 have been formed until the surface of the $SiO_2$ layer 31 becomes exposed. Then, the oxide films 35 and 36 are removed through etching. Through the etching process executed by using the mask C as described above, the lengths of the probe portion 12 and the holding portion 22 can be adjusted. In addition, since end surfaces 12e and 22e set in line with each other range perpendicular to the direction along which the probe portion 12 and the holding portion 22 extend, the specimen S can be held with even greater firmness.

Figure 14:
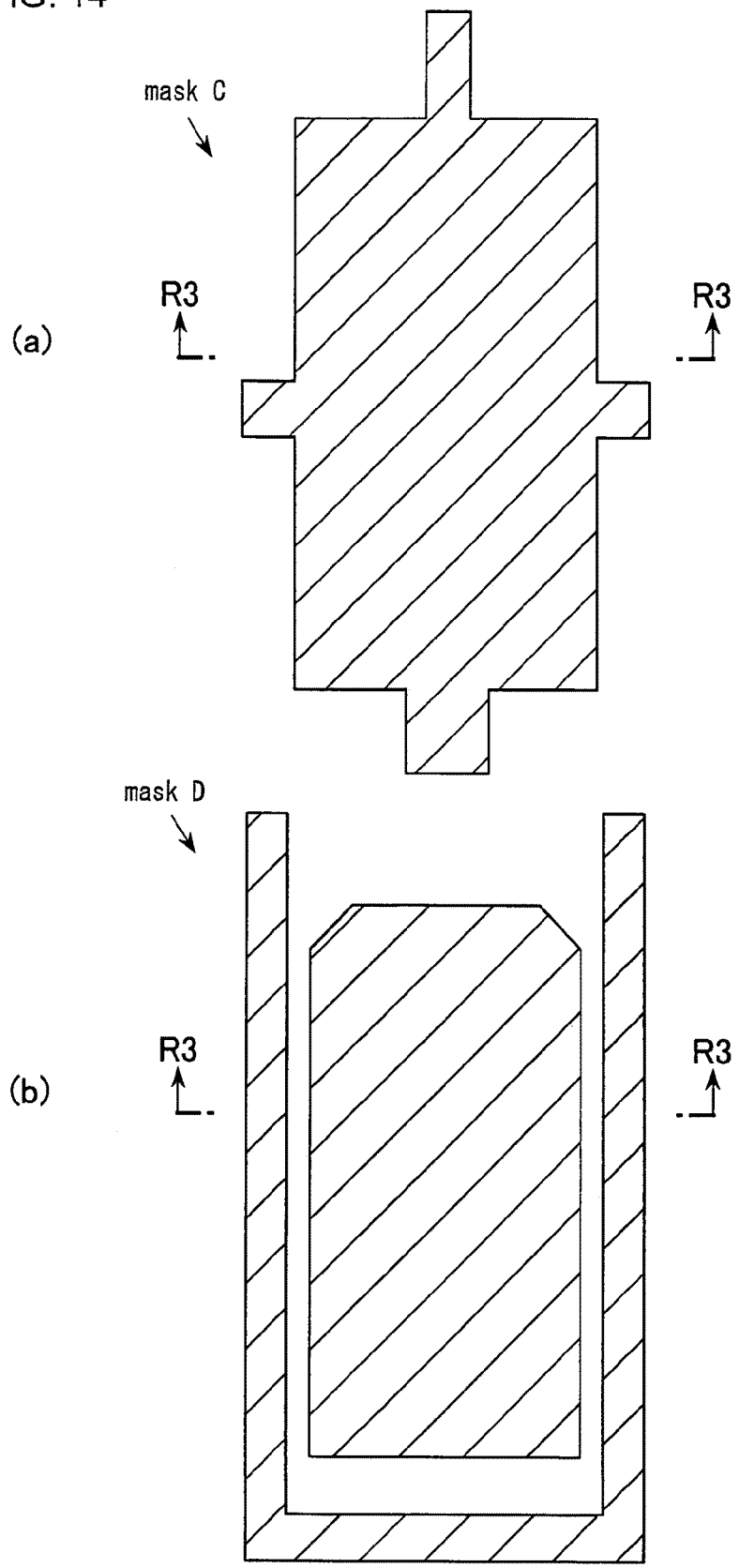
FIG. 14 A plan view of the mask C presented in ($a$) and a plan view of the mask D presented in ($b$)

In step h shown in FIG. 13 (b1), any unnecessary portion of the lower Si layer 33 is removed through etching in an ICP-RIE process executed by using a mask D shown in FIG. 14(b) starting at the rear surface of the SOI wafer 30. This etching process stops at the $SiO_2$ layer 32. Then, as any unnecessary $SiO_2$ layer 32 is removed with a hydrofluoric acid solution, the nanotweezer 1 achieving the intended shape is formed. It is to be noted that the portion removed through step h is indicated by the two-point chain line in FIG. 13 (b1). It is also to be noted that the area above line R3-R3 in FIG. 14 showing the masks C and D correspond to the portion processed as shown in FIG. 13.

Through the steps described above, the nanotweezer 1, which includes the observation probe 10 and the movable arm 20 formed as an integrated unit together with the supporting member 25 and extending along the same direction, is completed. The drive levers 23 and 24, too, are formed through a similar method while forming the observation probe 10 and the movable arm 20.

While the sequence of the manufacturing procedures for manufacturing a single nanotweezer 1 is explained above, the actual manufacturing process is executed in units of individual SOI wafers, i.e., the actual manufacturing process is executed through batch processing. Through such batch processing executed by adopting a photolithography method, numerous nanotweezers 1 are manufactured in a batch from a single SOI wafer, which allows a great reduction in the manufacturing cost.

By mounting the nanotweezer 1 achieved in the embodiment as described above in an AFM system, the following advantages are achieved.

(1) Since the observation probe 10 and the movable arm 20 are formed as an integrated unit from an SOI wafer through photolithography, the nanotweezer can be manufactured at low manufacturing cost. In addition, since a high level of dimensional accuracy is assured, the specimen S can be held firmly with the observation probe 10 and the movable arm 20.

(2) Since the widths or the thicknesses of the levers 11 and 21 are set so as to ensure that the resonance frequency f1 at the observation probe 10 is higher than the resonance frequency f2 at the movable arm 20, the observation probe 10 alone must be moved into close proximity to the specimen S and be made to vibrate assuming that the resonance frequency at which the observation probe 10 is excited in the tapping mode is set as the resonance frequencies of the observation probe. Thus, the presence of the movable arm 20 disposed next to the observation probe does not hinder the observation operation.

(3) Since the movable arm 20 is driven via a thermal actuator, no voltage is applied to the movable arm 20 and, as a result, even an electrically conductive specimen or a biological specimen can be held firmly with ease.

(4) When driving the movable arm 20 via the thermal actuator, the voltage is controlled through feedback control so as to set the potentials at the movable arm 20 and the observation probe 10 substantially equal to the ground potential. Consequently, application of any undesirable potential to the specimen S to be held is prevented.

Second Embodiment

Figure 15:
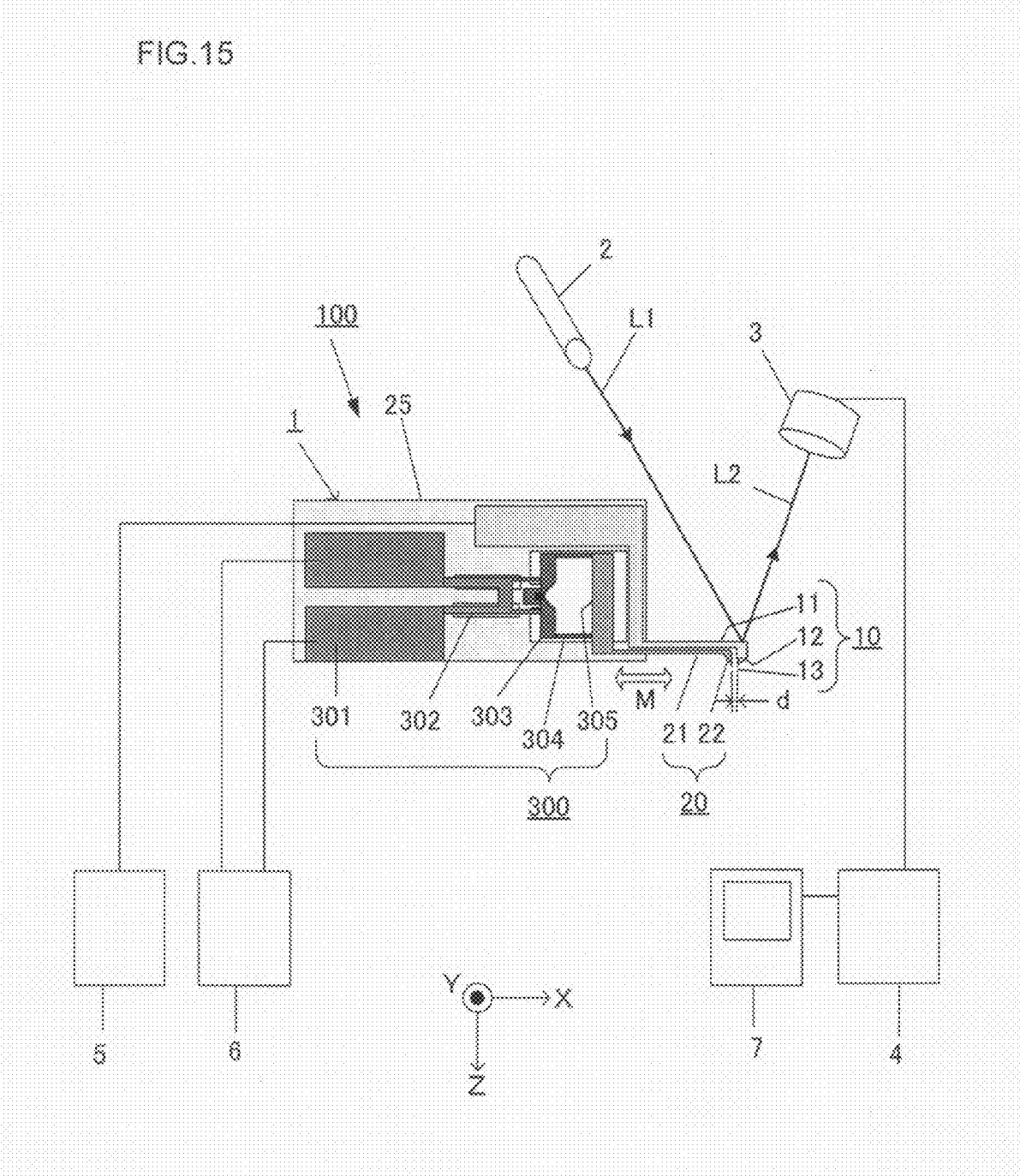
FIG. 15 A schematic diagram showing the overall structure adopted in the AFM apparatus achieved in a second embodiment FIG. 16 The positional relationship between the observation probe 10 and the movable arm 20 shown in ($a$) and the front end area shown in an enlargement in ($b$)

FIG. 15 schematically shows the overall structure adopted in the AFM system achieved in the second embodiment. It is to be noted that the same reference numerals are assigned to components identical to those in the first embodiment so as to preclude the necessity for a repeated explanation thereof. The movable arm 20 is driven by a drive mechanism 300 along an M direction (X direction). The drive mechanism 300 includes a pair of electrodes 301, a pair of thermal deformation portions 302, a pair of lever portions 303, a pair of linking portions 304 and a pair of beam portions 305. As in the first embodiment, the supporting member 25 of the nanotweezer 1 is detachably held by the holder (not shown) that can be three-dimensionally displaced via a 3-D stage (not shown).

The electrodes 301 are each connected to one of the thermal deformation portions 302, and the front ends of the thermal deformation portions 302 are set in contact with the corresponding lever portion 303. The lever portions 303, in turn, are connected to a beam portions 305 via the corresponding linking portions 304, and the beam portions 305 are connected to the base of the movable arm 20. The pair of electrodes 301 are connected to the power supply unit 6, and thus, power can be supplied from the power supply unit 6 to the thermal deformation portions 302 via the electrodes 301. As power is applied to the thermal deformation portions 302, the thermal deformation portions 302 become thermally expanded along the lengthwise direction due to the Joule heat, causing the movable arm 20 to move linearly along the +X direction. Accordingly, by adjusting the power supplied to the drive mechanism 300 functioning as the thermal expansion actuator, i.e., by adjusting the value of the electrical current supplied to the thermal deformation portions 32, the movable arm 20 can be engaged in reciprocal motion M along the X direction.

In the first embodiment explained earlier, the observation probe 10 and the movable arm 20 are set side-by-side along the Y direction and the movable arm 20 is driven along the Y direction via the thermal actuator. In the second embodiment, however, the observation probe 10 and the movable arm 20 are set side-by-side, one above the other along the Z direction and the movable arm 20 is made to move so as to slide along the X direction via the drive mechanism 300.

In FIG. 16, the positional relationship between the observation probe 10 and the movable arm 20 is shown in (a) and the front ends of the observation probe and the movable arm are shown in an enlargement in (b). It is to be noted that the drive mechanism 300 is shown in a simplified schematic illustration in FIG. 16. The observation probe 10 includes a lever 11 extending along the X direction, a holding portion 12 present at the front end of the lever 11 and projecting out along the Z direction and a probe portion 13 present at the front end of the holding portion 12. This observation probe 10 is formed as an integrated part of the supporting member 25 of the nanotweezer 1. The movable arm 20, too, includes a lever 21 extending along the X direction and a holding portion 22 located at the front end of the lever 21 and projecting out along the Z direction. The drive mechanism 300 is linked at the base of the movable arm 20.

The extent to which the lever 11 projects out beyond the supporting member 25 is set greater than the extent to which the lever 21 projects out beyond the supporting member 25. In addition, the width of the lever 11 measured along the Y direction and the width of the lever 21 measured along to the Y direction are equal to each other and the levers are set side-by-side along the Z direction over a predetermined distance from each other.

As shown in the enlargement presented in FIG. 16(b), the holding portion 12 and the holding portion 22 are disposed along the X direction, and the holding portions 12 and 22 include flat surfaces that face opposite each other. These surfaces 12a and 22a facing opposite each other range perpendicular to the X axis and parallel to each other. The distance d between the opposite surfaces 12a and 22a can be adjusted by displacing the movable arm 20 along the M direction.

The probe portion 13 and a front end 22b of the holding portion 22 are both pointed and the line connecting the probe portion 13 with the front end 22b of the holding portion 22 extends substantially parallel to the X axis. Thus, when the opposite surfaces 12a and 22a are placed in contact with each other by linearly displacing the movable arm 20, the probe portion 13 and the front end 22b of the holding portion 22 become aligned.

In reference to FIG. 17, the observation operation executed by using the nanotweezer 1 to observe a specimen surface and the holding operation executed by using the nanotweezer 1 to hold the specimen are explained. The observation operation is explained first. In the second embodiment the specimen surface is also observed in a tapping mode similar to that adopted in the first embodiment. The supporting member 25 of the nanotweezer 1 is caused to vibrate along the Z direction by the exciter unit 25 to induce resonance at the observation probe 10 in the second embodiment as well.

The holder (not shown) holding the nanotweezer 1 is three-dimensionally displaced until the nanotweezer 1 is set close to the specimen surface P with a tilt of a predetermined angle of inclination relative to the specimen surface P, as shown in FIG. 17(a). When executing the observation operation, the drive mechanism 300 is not engaged and the distance d between the holding portion 12 of the observation probe 10 and the holding portion 22 of the movable arm 20 is set to the maximum distance d0. Then, the probe portion 13 of the observation probe 10 is positioned in the vicinity of the specimen surface P over a very small distance in the atomic-diameter order and the specimen surface is observed through a method similar to that adopted in the first embodiment. The specific observation method is not described in detail here.

When observing the specimen surface P or a miniscule specimen S in the tapping mode by using the observation probe 10, the probe portion 13 of the observation probe 10, vibrating with a greater amplitude than the front end 22b of the movable arm 20 needs to be positioned in the vicinity of the specimen surface P or the miniscule specimen S. Accordingly, the nanotweezer in the second embodiment is designed so that the resonance frequency of the vibration of the lever 11 along the thickness-wise direction is higher than the resonance frequency of the vibration of the lever 21 as in the first embodiment by setting the thickness of the lever 11 at the observation probe 10 greater than the thickness of the lever 21 at the movable arm 20. As the supporting member 25 of the nanotweezer 1 is caused to vibrate at the selected resonance frequency via the exciter unit 5, the lever 11 alone resonates and vibrates to a significant extent along the Z direction. As a result, AFM observation via the observation probe 10 is enabled without the movable arm 20 ever getting in the way of the observation.

Once the nanotweezer 1 is moved to a position at which the miniscule specimen S is positioned between the holding portions 12 and 22, as shown in FIG. 17(b), the drive mechanism 300 is engaged in operation to grasp and hold the miniscule specimen S. Prior to the holding operation, the vibrating operation by the exciter unit 5 is stopped. The nanotweezer 1 is moved toward the miniscule specimen S while maintaining the distance d at d0. As an electrical current is supplied to the thermal deformation portions 302 at the drive mechanism 300, the thermal deformation portions 302 become thermally expanded due to Joule heat generated thereat and the extent of their displacement along the +X direction attributable to thermal expansion is increased by the lever portions 303. Then, the beam portions 305 and the movable arm 20 are driven along the +X direction via the linking portions 304.

Through the operation described above, the miniscule specimen S becomes clamped between the holding portion 22 and the holding portion 12, and the miniscule specimen S thus becomes held between the surfaces 12a and 22a ranging parallel to each other. During this operation, by adjusting the value of the electrical current supplied to the thermal deformation portions 302, the miniscule specimen S, can be held with an optimal level of holding force. The distance d between the holding portion 12 and the holding portion 22 holding the specimen between them equals d1 (d1<d0) which matches the size of the miniscule specimen.

Subsequently, by three-dimensionally moving a holder holding the nanotweezer 1 via the 3-D stage (not shown), the miniscule specimen S can also be three-dimensionally displaced, as shown in FIG. 17(c). The nanotweezer 1 achieved in the embodiment, which also includes the observation probe 10 and the movable arm 20, can be utilized to observe the specimen surface P or the miniscule specimen S and to hold the miniscule specimen S. In addition, since the miniscule specimen S can be held firmly while holding the opposite surfaces 12a and 22a of the holding portion 12 and 22 parallel to each other, the miniscule specimen S can be held with greater firmness compared to a miniscule specimen held with a nanotweezer in the related art that opens/closes as the holding portions move in a circular arc path. For this reason, the nanotweezer 1 achieved in the embodiment is ideal when a miniscule object with spherical surfaces, such as a cylindrical carbon nano tube or a spherical fullerene needs to be held. It is to be noted that the hold on the miniscule specimen S by the nanotweezer 1 can be released simply by lowering the voltage applied from the power supply unit 6 or resetting the voltage to zero so as to increase the distance d between the holding portion 22 and the holding portion 12.

Figure 18:
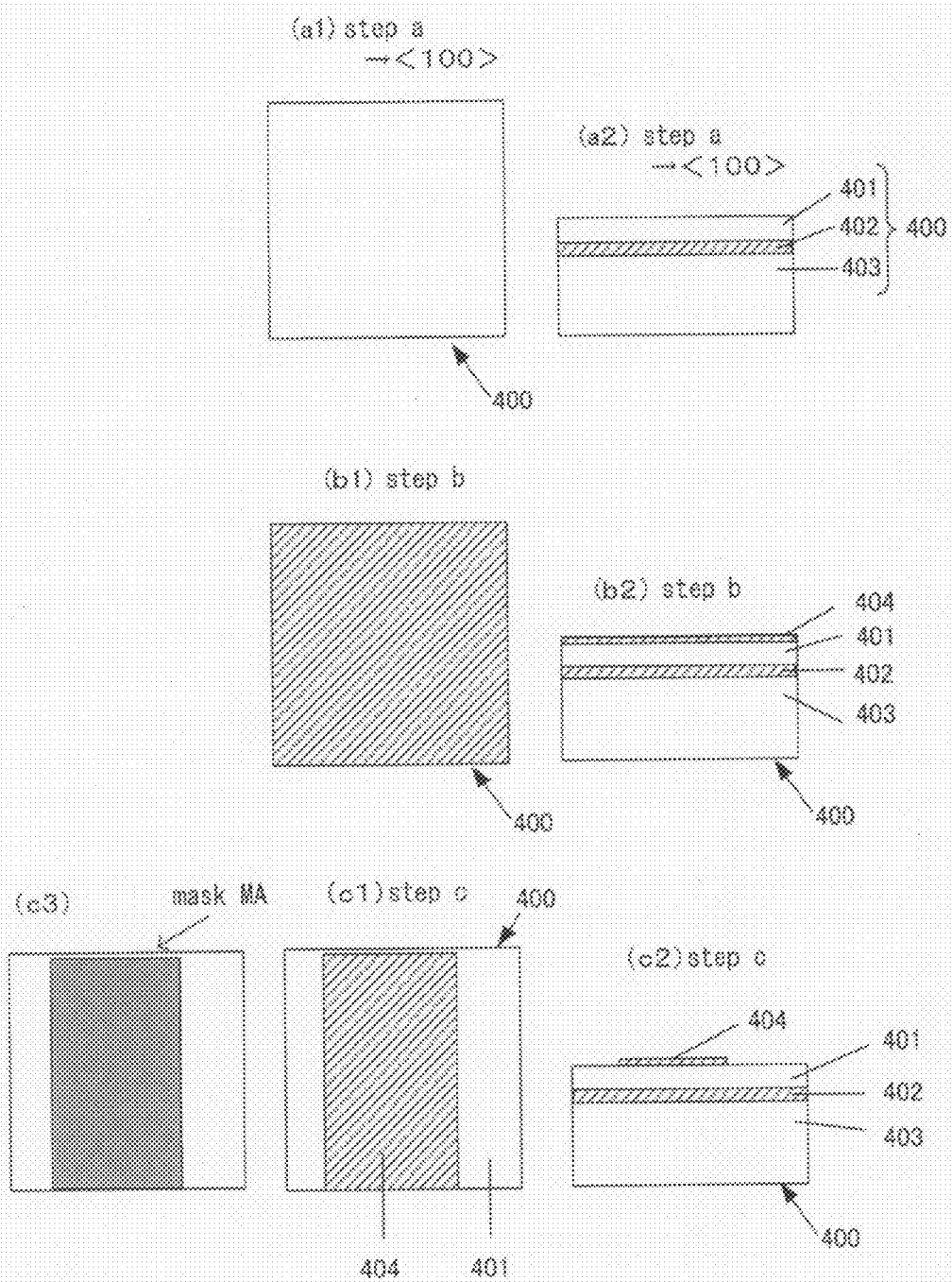
FIG. 18 Step a illustrated in ($a1$) and ($a2$), step b illustrated in ($b1$) and ($b2$), and step c illustrated in ($c1$)~($c3$)

Next, the manufacturing process through which the nanotweezer 1 achieved in the second embodiment is manufactured is explained. In the explanation, nine steps (processes), a through i are described in sequence. FIGS. 18(a1) and 18(a2) illustrate step a, with (a1) presenting a plan view and (a2) presenting a sectional view. In step a, and SOI wafer 400 is prepared. The SOI wafer 400 used in the embodiment includes an upper Si layer 401 with a thickness of 50 um, an SiO$_2$ layer 402 with a thickness of 1 um and a lower Si layer 403 with a thickness of 400 um. The upper Si layer 401 is formed so that the basal plane (001) of single-crystal Si is set at the surface thereof, with the direction (100) extending to the left and the right in the figure.

FIGS. 18(b1) and 18(b2) illustrate step b, with (b1) presenting a plan view and (b2) presenting a sectional view. In step b, the surface of the upper Si layer 401 is oxidized through steam oxidation (wet oxidation) by using steam generated through a high-temperature reaction of oxygen gas and hydrogen gas and an oxide film 404 is formed over the entire surface of the upper Si layer 401 over a thickness of 0.3 um.

FIGS. 18 (c1), 18(c2) and 18(c3) illustrate step c with (c1) presenting a plan view, (c2) presenting a sectional view and (c3) presenting a plan view of a mask MA used in step c. The mask MA is a resist mask formed through photolithography. In step c, BHF etching is executed by using the mask MA so as to remove part of the oxide film 404.

Figure 19:
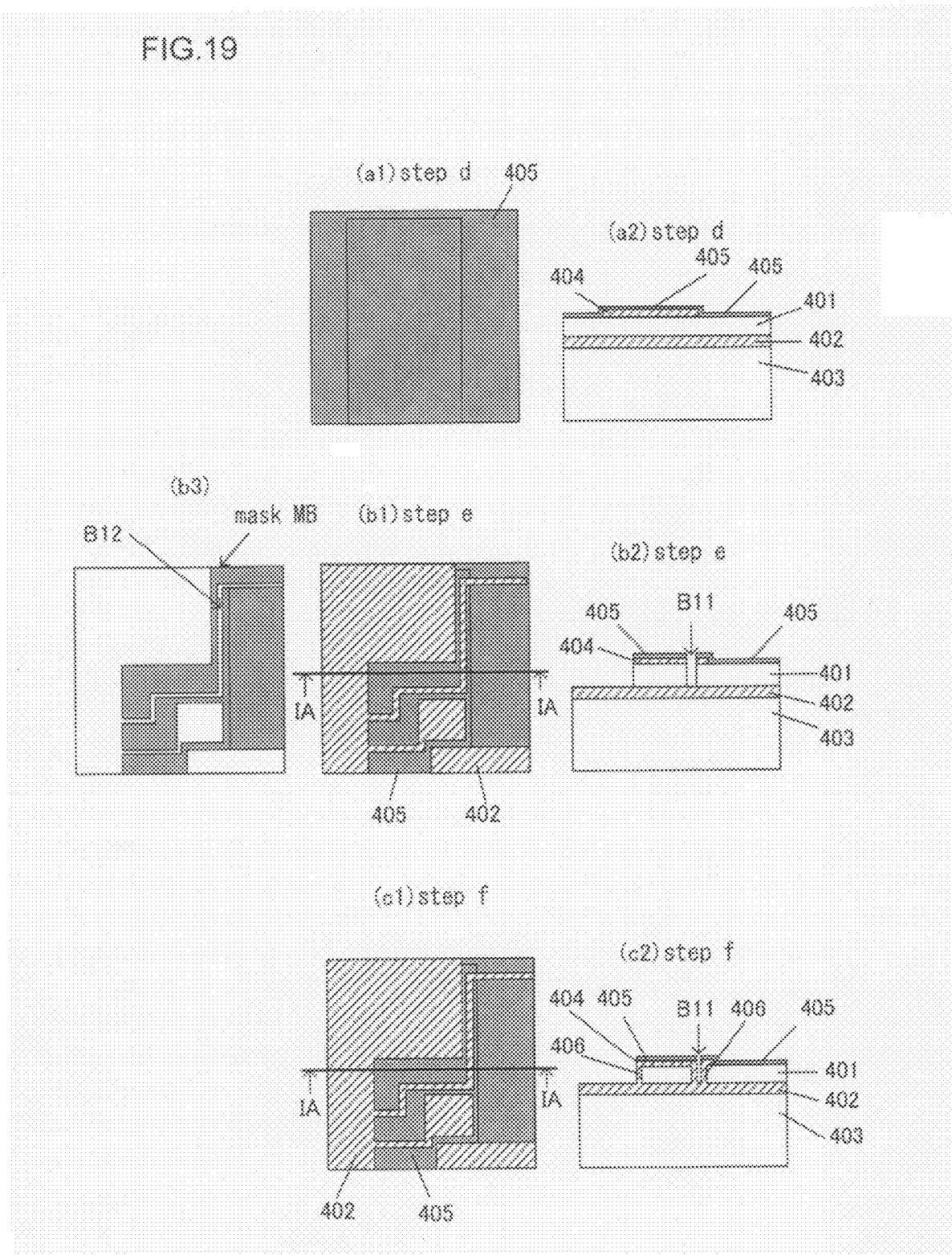
FIG. 19 Step d illustrated in ($a1$) and ($a2$), step e illustrated in ($b1$)~($b3$) and step f illustrated in ($c1$) and ($c2$)

FIGS. 19(a1) and 19(a2) illustrate step d with (a1) presenting a plan view and (a2) presenting a sectional view. In step d, a silicon nitride film (an Si$_3$N$_4$ film or an SiN film) is formed through LP CVD over a thickness of 0.05 um atop the oxide film 404 and the exposed upper Si layer 401.

FIGS. 19(b1), 19(b2) and 19(b3) illustrate step e with (b1) presenting a plan view, (b2) presenting a sectional view taken along IA-IA and (b3) presenting a plan view of a mask MB used in step e. In step e, upon forming the mask MB, the SiN film 405 is etched through RIE and then, the oxide film 404 having become exposed by etching the SiN film 405, is removed by through a BHF etching process. Subsequently, the portion of the upper Si layer 401 having become exposed through the BHF etching process, is etched by executing ICP-RIE (inductively coupled plasma-reactive ion etching). The ICP-RIE process advances substantially perpendicular in the thickness-wise direction and stops at the SiO$_2$ layer 402. As a result, a groove B11 with a depth of 50 um, which is equal to the thickness of the upper Si layer 401, is formed as shown in FIG. 19 (b2). It is to be noted that the groove B11 is formed through an etching process starting at anon-shielding portion B12 of the mask B.

FIGS. 19(c1) and 19(c2) illustrate step f, with (c1) presenting a plan view and (c2) presenting a sectional view taken along IA-IA. In step f, the exposed surface of the upper Si layer 401 is oxidized through steam oxidation and an oxide film 406 is formed over a thickness of 0.3 um. This oxide film 406 functions as a protective film to prevent the inner walls and the like of the groove B11 from becoming etched during the subsequent anisotropic etching process to be detailed later.

FIGS. 20(a1) and 20(a2) illustrate step g, with (a1) presenting a plan view and (a2) presenting a sectional view taken along IA-IA. In step g, the SiN film 405 is removed through RIE. As a result, the upper Si layer 401 becomes exposed over an area A10 where the SiN film 405 has been previously present. FIGS. 20(b1) and 20(b2) illustrate step h, with (b1) presenting a plan view and (b2) presenting a sectional view taken along IA-IA. In step h, the upper Si layer 401 present in the area A10 is anisotropically etched by using a TMAH (tetra-methyl ammonium hydroxide) solution. The oxide films 404 and 406, which are not readily etched with TMAH, function as stopper layers during the anisotropic etching process. Through this anisotropic etching process, three triangular cones all constituted with the upper Si layer 401 and having sloping surfaces C1, C2 and C3 are formed. The sloping surfaces C1, C2 and C3 are (111) planes with a low etching rate. It is to be noted that a KOH solution instead of the TMAH solution may be used in step h.

FIGS. 20(c1), 20(c2) and 20(c3) illustrate step i with (c1) presenting a plan view, (c2) presenting a sectional view taken along IA-IA and (c3) presenting a plan view of a mask MC used in step i. In step i, any unnecessary portion of the lower Si layer 403 is removed through an etching process executed by using the mask MC shown in FIG. 20(c3) and starting at the rear surface of the SOI wafer 400, i.e., on the side where the lower Si layer 403 is present and the remaining SiO$_2$ layer 402 is also removed. The lower Si layer 403 present over an area A12 covered with a shielding portion A13 of the mask MC remains unetched to eventually form the supporting member 25, as shown in FIG. 20(c2). In addition, through the etching process executed on the SiO$_2$ layer 402 as described above, the SiO$_2$ layer 402 present between the Si layer 401 and the lower Si layer 403 over the area corresponding to the movable arm 20 and the areas ranging from the thermal deformation portions through the beam portions at the drive mechanism 300 is etched and lifted off the supporting member 25, and thus, displacement attributable to thermal deformation is enabled.

While the manufacturing method described above imposes restrictions with regard to the widths of the observation probe 10 and the movable arm 20 in conformance to the thickness (e.g., 50 um, as in the explanation provided above) of the upper Si layer 401, the dimensions of the observation probe and the movable arm along the lengthwise direction and the thickness-wise direction can be set freely through photolithography. In other words, the lengths and the thicknesses of the observation probe 10 and the movable arm 20 can be set with ease to optimal values ideal for achieving the required resonance frequencies for vibrations in the tapping mode. In addition, the distance d between the holding portion 12 and the holding portion 22 can also be set freely.

While the sequence of manufacturing procedures for manufacturing a single nanotweezer 1 is explained above, the actual manufacturing process is executed in units of individual SOI wafers, i.e., the actual manufacturing process is executed through batch processing. Through such batch processing executed by adopting a photolithography method, numerous nanotweezers 1 are manufactured in a batch from a single SOI wafer, which allows a great reduction in manufacturing cost.

By mounting the nanotweezer 1 achieved in the embodiment as described above in an AFM system, the following advantages are achieved.

(1) Since the observation probe 10 and the movable arm 20 are formed as an integrated unit from an SOI wafer through photolithography, the nanotweezer can be manufactured at low manufacturing cost. In addition, since a high level of dimensional accuracy is assured, the specimen S can be held firmly by the observation probe 10 and the movable arm 20.

(2) Since the miniscule specimen S is grasped and held between the two holding portions by linearly sliding the holding portion 22 of the movable arm 20 toward the holding portion 12 of the observation probe 10, the holding operation can be executed with ease.

(3) Since the movable arm 20 is driven via a thermal actuator, no voltage is applied to the movable arm 20 and, as a result, even an electrically conductive specimen or a biological specimen can be held firmly with ease.

(4) Since the thicknesses of the levers 11 and 21 are set so as to ensure that the resonance frequency at the observation probe 10 is higher than the resonance frequency at the movable arm 20, the observation probe 10 alone must be moved in close proximity to the specimen surface P and be made to vibrate, and thus, the observation operation is not hindered by the movable arm 20.

Third Embodiment

Figure 21:
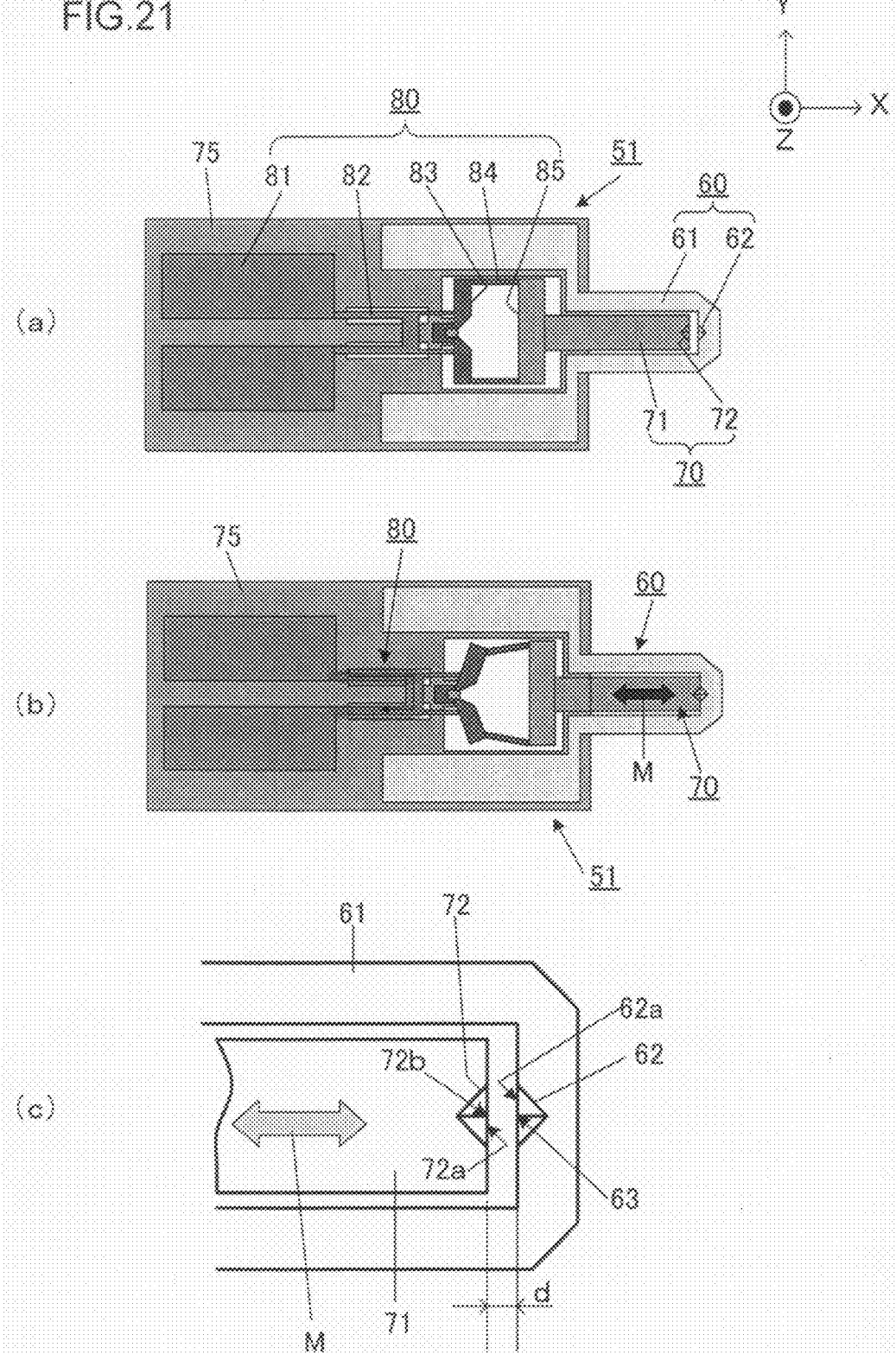
FIG. 21 Schematic illustrations of the structure adopted in the nanotweezer achieved in a third embodiment, with the drive mechanism 80 thereof in a non-driving state in (a), the drive mechanism 80 in a driving state in (b) and a partial enlargement of the nanotweezer presented in (c)

FIG. 21 presents schematic plan views, showing the structure adopted in the nanotweezer achieved in the third embodiment, with FIG. 21(a) showing a drive mechanism 80 thereof in a non-driving state, FIG. 21(b) showing the drive mechanism 80 in a driving state and FIG. 21(c) showing the nanotweezer in FIGS. 21(a) and 21(b) in a partial enlargement. As shown in FIG. 21(a), a nanotweezer 51 comprises an observation probe 60, a movable arm 70, a supporting member 75 and the drive mechanism 80. The observation probe 60, which constitutes an integrated unit together with the supporting member 75, includes a U-shaped (horseshoe-shaped) lever 61 extending along the X direction, a holding portion 62 projecting out along the Z direction in the vicinity of the front end of the lever 61 and a probe portion 63 disposed at the front end of the holding portion 62.

The probe portion 63 is located at the front end of the holding portion 62. The movable arm 70 is slidably disposed within a U-shaped space formed by the lever 61. At the front end of a lever 71 of the movable arm 70, extending along the X direction, a holding portion 72 projecting out along the Z direction is formed. The lever 61 and the lever 71 are positioned on a single plane, the thicknesses of the lever 61 and the lever 71 measured along the Z direction are equal to each other and the heights assumed by the probe portion 63 and the holding portion 72 along the Z direction are also equal to each other.

Figure 22:
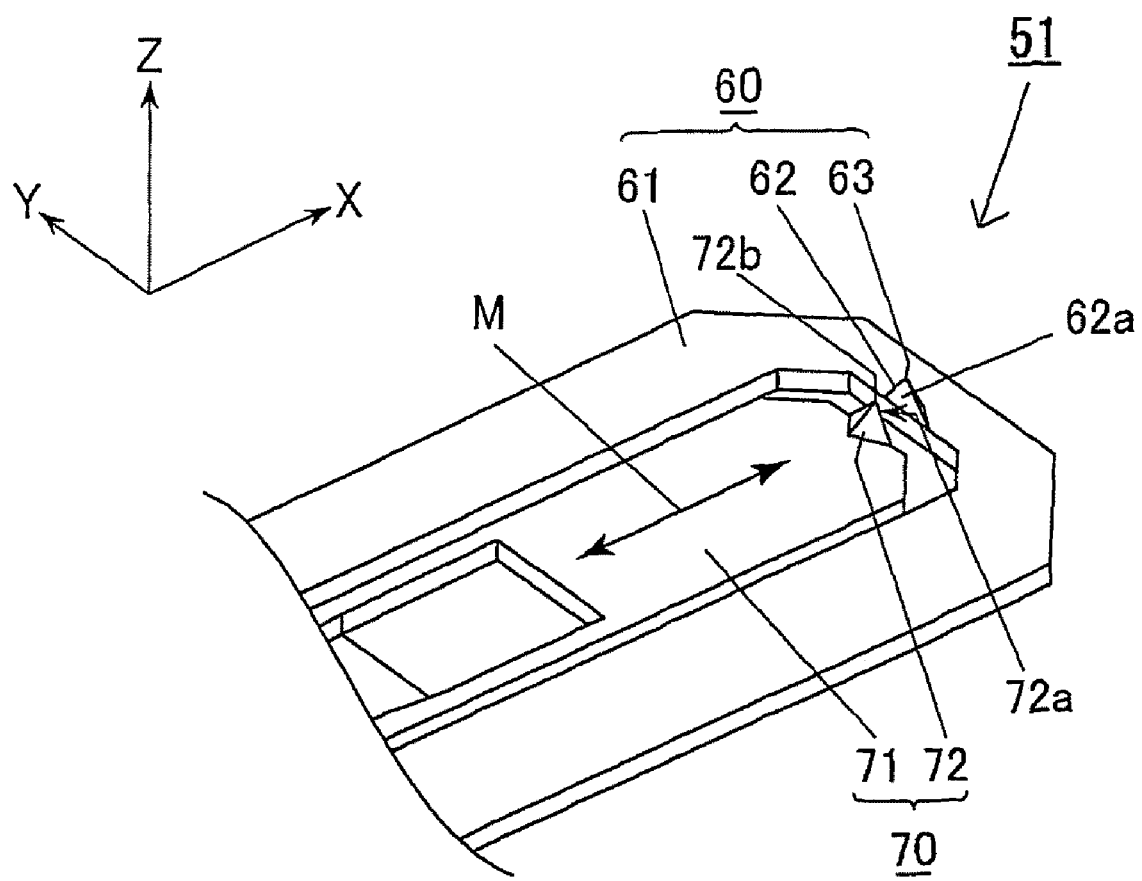
FIG. 22 A schematic illustration of the essential structure adopted in the nanotweezer 51

FIG. 22 schematically illustrates the essential structural elements of the nanotweezer 51 achieved in the third embodiment. A surface 62a of the holding portion 62 and a surface 72a of the holding portion 72, facing opposite each other, range parallel to each other. In addition, the probe portion 63 and a front end 72b of the holding portion 72 are each pointed, and the line connecting the probe portion 63 with the front end 72b of the holding portion 72 extends substantially parallel to the sliding direction M along which the lever 71 slides. The nanotweezer 51 holds a miniscule specimen between these opposite surfaces 62a and 72a, and AFM observation of a specimen surface is conducted by using the probe portion 63.

The base of the movable arm 70 is linked to the drive mechanism 80 and the movable arm 70 is thus driven to slide along the M direction via the drive mechanism 80. Since the drive mechanism 80 adopts a structure similar to that of the drive mechanism 300 in the second embodiment, a detailed explanation of the drive mechanism 80 is omitted. In addition, as is the nanotweezer 1 achieved in the first embodiment, the nanotweezer 51 in the third embodiment is installed in the AFM system 100 shown in FIG. 15 to be used in AFM observation of a specimen surface and also to hold a miniscule specimen.

Figure 23:
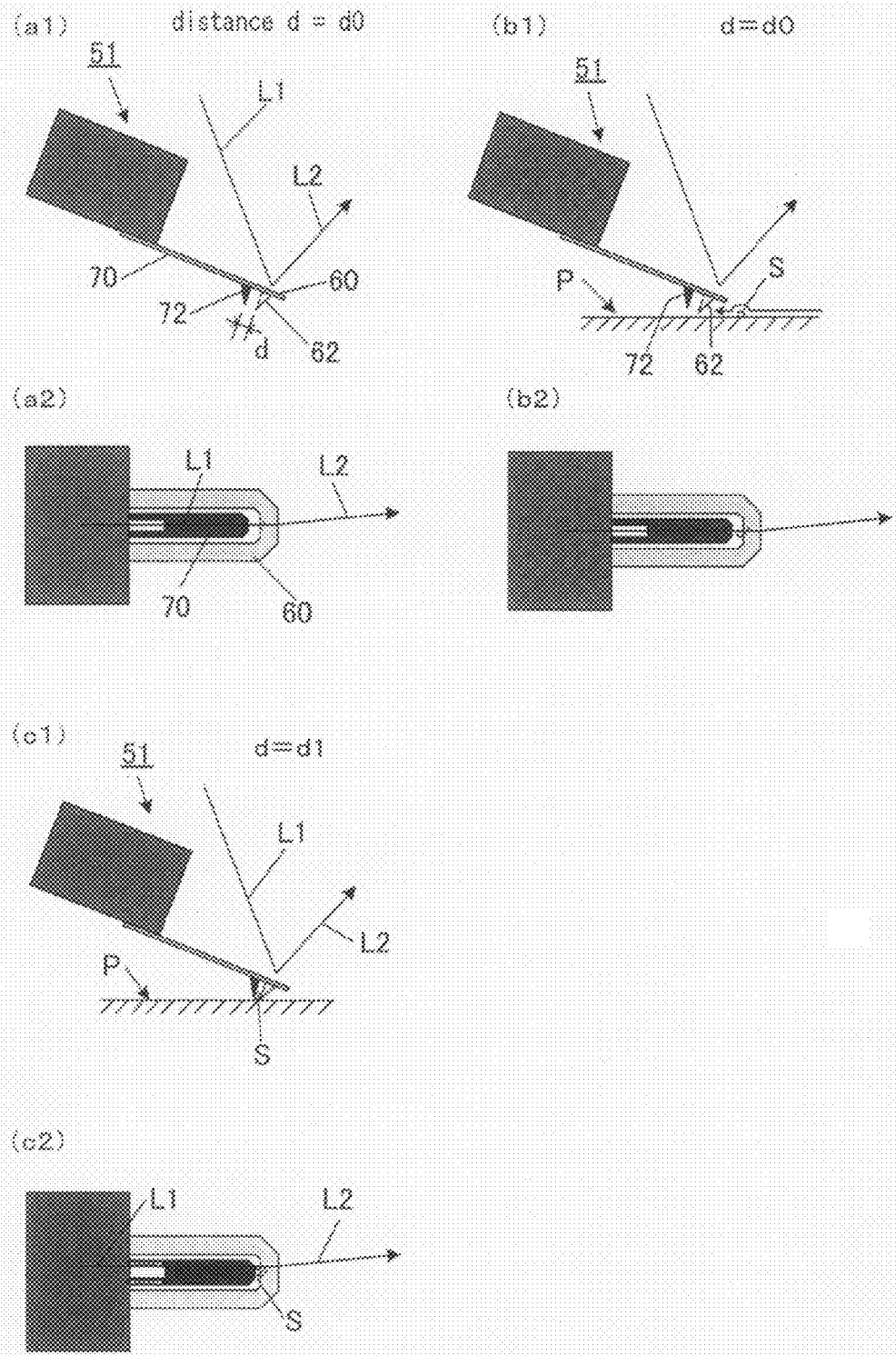
FIG. 23 The observation/holding operations executed by using the nanotweezer 51, with (a1)~(b2) illustrating the observation operation and (c1) and (c2) illustrating the holding operation FIG. 24 Step a illustrated in (a1)~(a3) and step b illustrated in (b1) and (b2)

FIG. 23 illustrates the observation operation executed by using the nanotweezer 51. As shown in FIGS. 23(a1) and 23(a2), the nanotweezer 51 is moved into close proximity to a specimen surface P at a tilt with a predetermined angle of inclination relative to the specimen surface. At this time, the distance d between the holding portion 62 of the observation probe 60 and the holding portion 72 of the movable arm 70 is maintained at the maximum distance d0. It is to be noted that L1 is light originating from the laser light source 2, which is radiated onto the upper surface of the observation probe 60. Light L2 reflected off the upper surface of the observation probe 60 enters the two-element split photodiode 3.

Then, as shown in FIGS. 23(b1) and 23(b2), the probe portion 63 is positioned very close to the specimen surface P over a distance in the atomic-diameter order while maintaining the distance d between the opposite surfaces 62a and 72a at d0 and the specimen surface is observed in the tapping mode. In the nanotweezer 51 achieved in the third embodiment, the lever 61 alone is made to resonate and vibrate with a large amplitude by setting the width of the lever 61 at the observation probe 60 greater than the width of the lever 71 at the movable arm 70.

FIGS. 23(c1) and 23(c2) illustrate the holding operation executed by using the nanotweezer 51 to hold a miniscule specimen S. As is the nanotweezer 31 achieved in the second embodiment, the nanotweezer 51 is also moved so as to position the miniscule specimens S between the holding portion 72 and the holding portion 62 maintaining the distance d0 from each other. Then, the movable arm 70 is made to slide along the +X direction until the miniscule specimen S is clamped between the holding portion 72 and the holding portion 62. In this embodiment the opposite surfaces 62a and 72a holding the miniscule specimen S between them also range parallel to each other and thus, the miniscule specimen S can be held with a high level of firmness.

Figure 24:
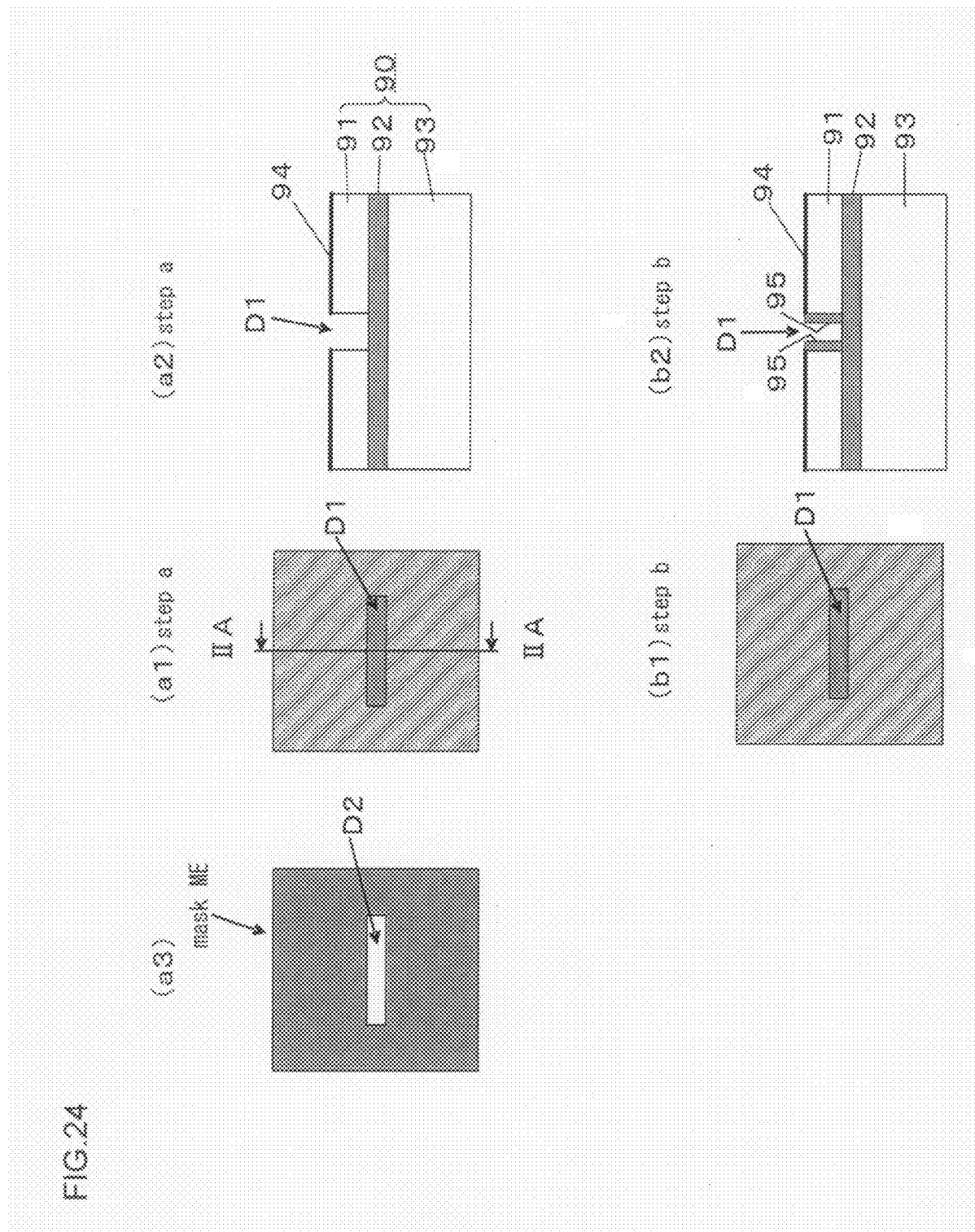

Next, the manufacturing process through which the nanotweezer 51 is manufactured is explained. FIGS. 24(a1) through 24(a3) illustrate step a, with (a1) presenting a plan view, (a2) presenting a sectional view taken along IIA-IIA and (a3) showing a mask ME used in step a. An SOI wafer 90 constituted with an upper Si layer 91 (with a thickness of 10 um), an $SiO_2$ layer 92 (with a thickness of 1 μm) and a lower Si layer 93 (with a thickness of 400 um) is first prepared and a silicon nitride film (an $Si_3N_4$ film or an SiN film) 94 is formed over a thickness of 0.05 μm through LPCVD ratio the upper Si layer 91.

Subsequently, an RIE process is executed by using the mask ME shown in FIG. 24(a3) to remove the SiN film 94 present or an area D1 corresponding to an opening D2 in the mask ME, and then, the upper Si layer 91 is also etched along the thickness-wise direction through ICP-RIE. Since the ICP-RIE process stops at the $SiO_2$ layer 92, a groove D1 with a depth of 10 μm, which is equal to the thickness of the upper Si layer 91, is formed, as shown in FIG. 24(a2). In step b shown in FIGS. 24(b1) and 24(b2), an oxide film 95 with a thickness of 0.3 μm is formed through steam oxidation over the exposed portions (the inner walls of the groove D1) of the upper Si layer 91.

Figure 25:
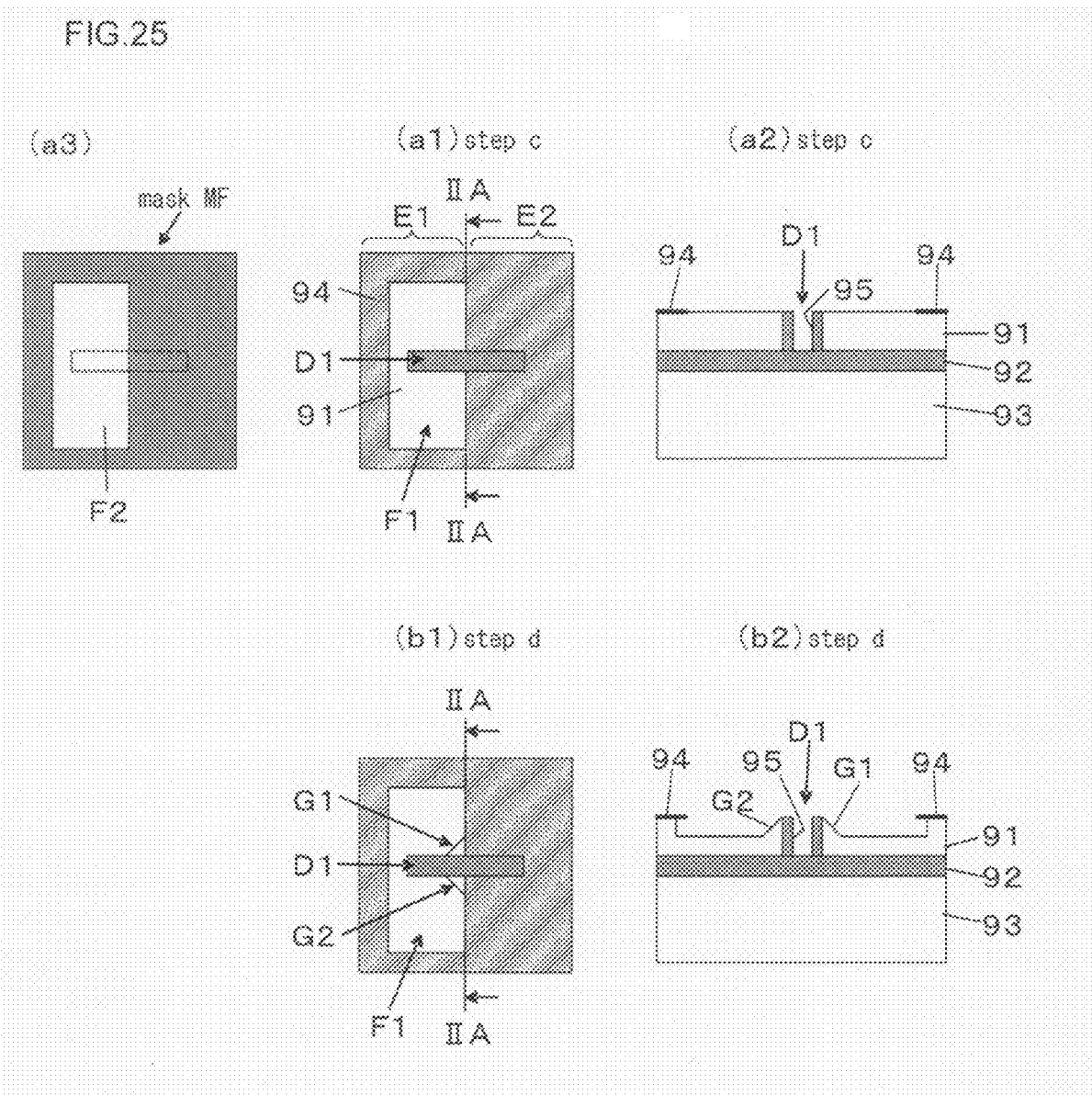
FIG. 25 Step c illustrated in (a1)~(a3) and step d illustrated in (b1) and (b2)

FIGS. 25(a1) through 25(a3) illustrates step c, with (a1) presenting a plan view, (a2) presenting a sectional view taken along IIA-IIA and (a3) showing a mask MF. In step c shown in FIGS. 25(a1) and 25(a2), the SiN film 94 present in an area E1 to the left of the line IIA-IIA is removed through etching over an area F1 by using the mask MF shown in FIG. 24(a3) until the upper Si layer 91 becomes exposed. The area F1 corresponds to a non-shielding portion F2 of the mask MF.

FIGS. 25(b1) and 25(b2) illustrate step d, with (b1) presenting a plan view and (b2) presenting a sectional view taken along IIA-IIA. In step d, the upper Si layer 91 in the area F1 is anisotropically etched by using a KOH solution. This etching process is stopped at, for instance, a time point at which the etching depth has become equal to 5 μm, half the fitness of the upper Si layer 91, so as to form two triangular cones on the two sides of the groove D1, which have sloping surfaces G1 and G2 and assume a height of 5 μm. The sloping surfaces G1 and G2 are each positioned on the (111) plane of the Si crystal and the etching rate at the (111) plane is lower than that at the (001) plane ranging parallel to the substrate surface. It is to be noted that a TMAH solution, instead of the KOH solution, may be used in step d.

Figure 26:
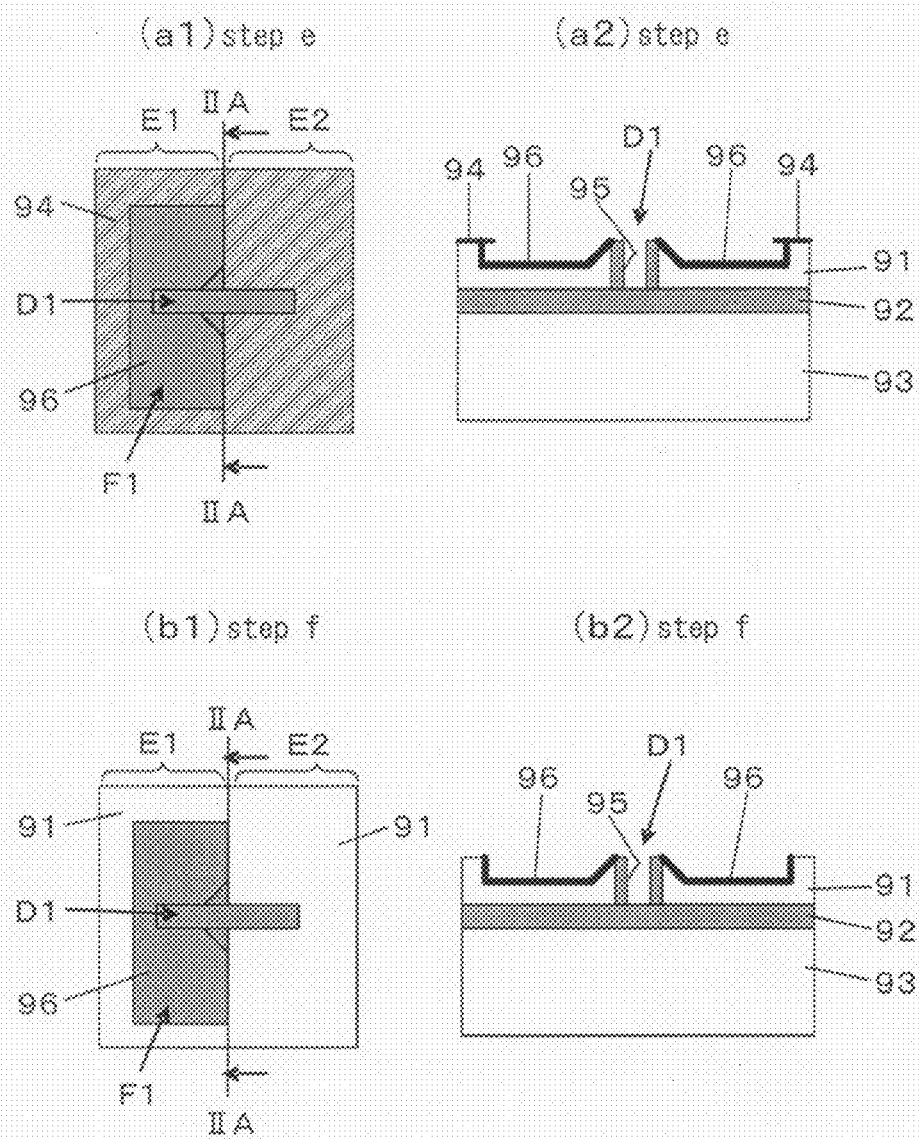
FIG. 26 Step e illustrated in (a1) and (a2) and step f illustrated in (b1) and (b2)

FIGS. 26(a1) and 26(a2) illustrate step e, with (a1) presenting a plan view and (a2) presenting a sectional view taken along IIA-IIA. In step e, an oxide film 96 is formed over the exposed surface (the area F1) of the upper Si layer 91. FIGS. 26(b1) and 26(b2) illustrate step f, with (b1) presenting a plan view and (b2) presenting a sectional view taken along IIA-IIA. In step f, all the remaining SiN film 94 is removed through RIE. Thus, the upper Si layer 91 also becomes exposed over an area E2 to the right of line IIA-IIA.

Figure 27:
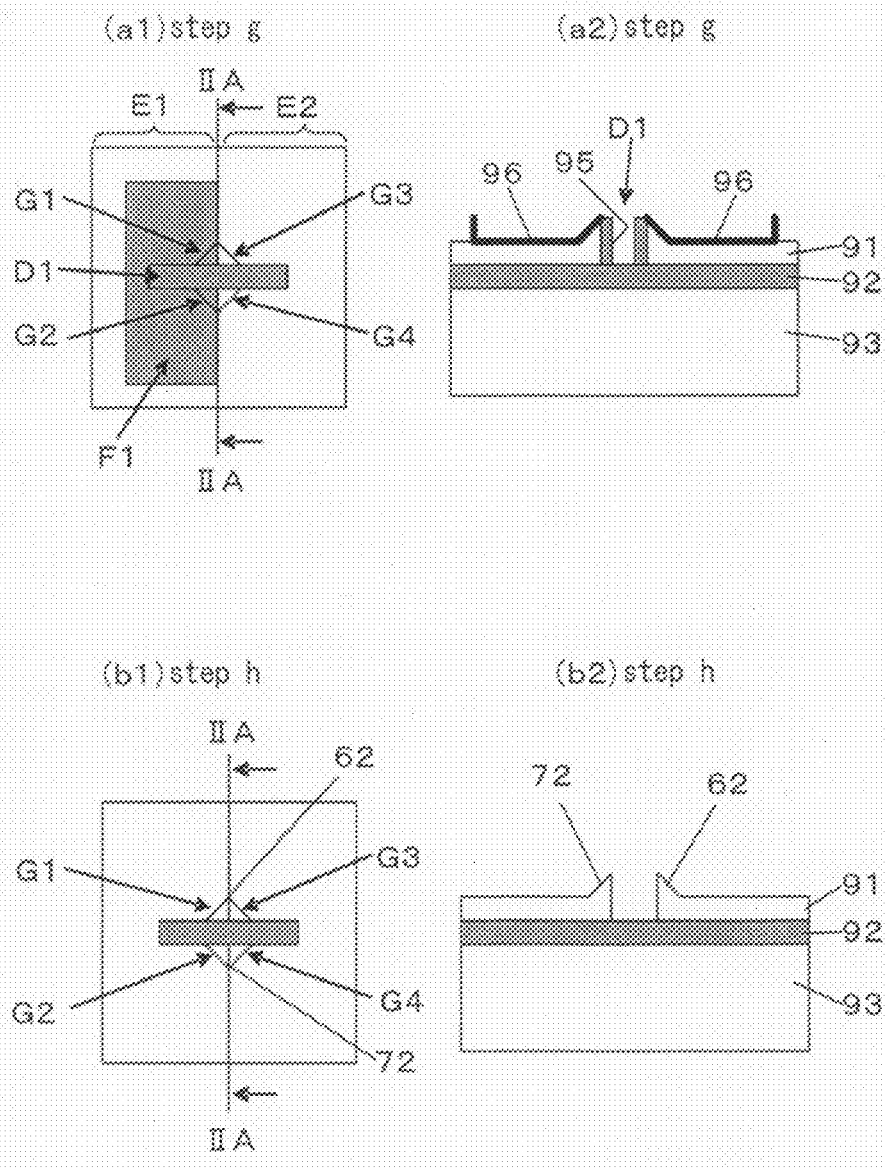
FIG. 27 Step g illustrated in (a1) and (a2) and step h illustrated in (b1) and (b2)

FIGS. 27(a1) and 27(a2) illustrate step g, with (a1) presenting a plan view and (a2) presenting a sectional view taken along IIA-IIA. In step g, a process similar to that executed in step d in FIGS. 27(b1) and 27(b2) is executed to anisotropically edge the upper Si layer 91 over the area E2. The anisotropic etching of the area E2 also stops as soon as the etching depth reaches 5 μm. Thus, two more triangular cones are formed along the line IIA-IIA, which have sloping surfaces G3 and G4. The sloping surfaces G3 and G4 are also each set on the (111) plane, as are the sloping surfaces G1 and G2.

FIGS. 27(b1) and 27(b2) illustrate step h, with (b1) presenting a plan view and (b2) presenting a sectional view taken along IIA-IIA. In step h, the oxide film 96 having been formed in order to protect the area F1 is removed through etching. The combination triangular cone constituted with the triangular cone that includes the sloping surface G1 and the triangular cone that includes the sloping surface G3 eventually forms the holding portion 62 and the probe portion 63, whereas the combination triangular cone constituted with the triangular cone that includes the sloping surface G2 and the triangular cone that includes the sloping surface G4 eventually forms the holding portion 72. Since the area D1 assumes a rectangular shape, the surfaces of the holding portion 62 and the holding portion 72 facing opposite each other range parallel to each other.

Figure 28:
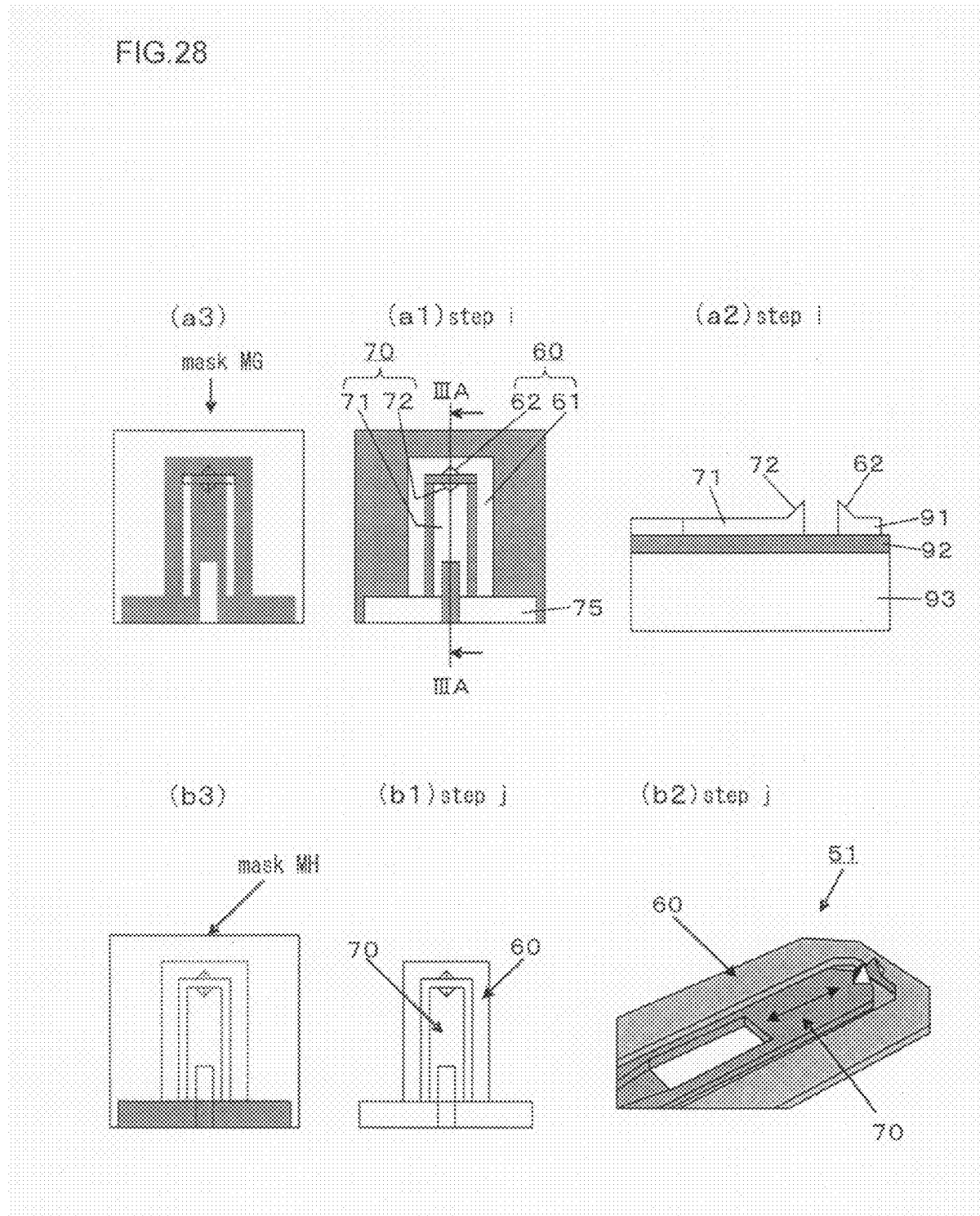
FIG. 28 Step i illustrated in (a1)~(a3) and step D illustrated in (b1)~(b3)

FIGS. 28(a1) through 28(a3) illustrate step i, with (a1) presenting a plan view, (a2) presenting a sectional view taken along IIIA-IIIA and (a3) showing a mask MG. In addition, FIGS. 28(b1) through 28(b3) illustrate step j, with (b1) presenting a plan view and (b2) and (b3) respectively presenting a plan view and a perspective of the observation probe 60 and the movable arm 70 having been formed. It is to be noted that the illustrations presented in FIGS. 28(a1), 28(a3), 28(b1) and 28(b3) assume ranges greater than those assumed in FIGS. 24 through 27.

In step i shown in FIGS. 28(a1) and 28(a2), an ICP-RIE process is executed by using the mask MG to define the outlines of the observation probe 60 and the movable arm 70. Through this etching process, part of the outline of the supporting member 75 is also formed. As shown in FIG. 28(a1), the basic shapes of the observation probe 60 and the movable arm 70 are formed with the upper Si layer 91 as the upper Si layer 91 present at the boundary between the observation probe 60 and the movable arm 70 and the surrounding area around the observation probe and the movable arm is removed. It is obvious that over the areas where the upper Si layer 91 is removed, the $SiO_2$ layer 92 is exposed.

In step j shown in FIGS. 28(b1) and 28(b2), an ICP-RIE process is executed by using a mask MH so as to separate the observation probe 60 and the movable arm 70 from each other and define the outline of the supporting member 75. In step j, any unnecessary portions of the lower Si layer 93 and the $SiO_2$ layer 92 are removed from the rear surface of the SOI wafer 90, i.e., from the side where the lower Si layer 93 is present. Through this procedure, the formation of the nanotweezer 51 which includes the observation probe 60 and the movable arm 70, extending along a single direction and constituting an integrated unit together with the supporting member 75, is completed. In addition, the drive mechanism 80 is also concurrently formed through a similar method while forming the observation probe 60 and the movable arm 70. The drive mechanism 80 is also constituted with the upper Si layer 91 as are the observation probe 60 and the movable arm 70.

The manufacturing method described above allows the dimensions of the observation probe 60 and the movable arm 70, measured along the lengthwise direction (X direction), the widthwise direction (Y direction) and the thickness-wise direction (Z direction), to be selected freely through photolithography. The lengths and the widths are determined in correspondence to the mask dimensions, and the width of the lever 61 at the observation probe 60 can easily be set to a value optimal for achieving the required resonance frequency of the vibration in the tapping mode. In addition, the distance d (=maximum distance d0) between the holding portion 62 and the holding portion 72 can also be set freely. The thicknesses of the leavers 61 and 71, the combined height of the holding portion 62 and the probe portion 63 and the height of the holding portion 72, which are all determined in correspondence to the extent to which the upper Si layer 91 is etched, should be controlled during the manufacturing process.

By installing the nanotweezer 51 in the third embodiment in an AFM system, advantages similar to those of the nanotweezer in the second embodiment are realized. It is to be noted that better accuracy is assured by adjusting the width of the lever 61 at the observation probe 60 rather than the thickness of the lever 61 when selecting optimal dimensions for achieving the resonant frequency of vibration in the tapping mode, as explained earlier.

Fourth Embodiment

FIG. 29 illustrates the fourth embodiment, with (a) presenting a plan view of a nanotweezer 1 taken on the specimen surface side and (b) and (c) each presenting an enlargement illustrating the structure assumed that a front end R of the nanotweezer 1. Arms 201 and 202 are formed at the supporting member 25. Reference numerals 203 and 204 indicate drive units that drive the arms 201 and 202 to open/close along the direction indicated by the arrows in the figure. The drive units 203 and 204 are thermal expansion actuators that are caused to expand by Joule heat and are engaged in operation by power supplied from a power source 209. Reference numerals 205 and 206 indicate electrodes of the drive units 203 and 204 respectively, and the power source 209 is connected to the electrodes 205 and 206.

The structure shown in FIG. 29(b) or the structure shown in FIG. 29(c) may be adopted in the front end area R at the arms 201 and 202. It is to be noted that FIGS. 29(b) and 29(c) each show the arms in an open state so as to illustrate the structure of the front end more clearly. The structure illustrated in FIG. 29(b) is similar to that adopted in the nanotweezer achieved in the first embodiment explained earlier, and includes holding portions 201a and 202a with a right-angle triangle section formed therein. The front end structure illustrated in FIG. 29(c) is similar to that of the nanotweezer achieved in the third embodiment and includes projections 201b and 202b, assuming the shape of an angular cone or a pyramid formed on the flat surfaces of the arms 201 and 202 toward the specimen.

FIG. 30 illustrates the holding operation executed by using the arms 201 and 202 to hold the specimen S. While the power source 209 is in an OFF state, the arms 201 and 202 are closed, as shown in FIG. 29(a). In the embodiment, boron is doped over the silicon layers at the drive units 203 and 204, and thus; when the power source 209 is in an OFF state, stress is applied along the direction indicated by the arrows pointing upward and downward in FIG. 29 so as to cause the drive units 203 and 204 to contract.

In order to grasp and hold the specimen S, the nanotweezer 1, still in the closed state, is moved to the vicinity of the specimen S. Next, the power source 209 is turned on to apply a voltage to the electrodes 205 and 206. In response, an electrical current flows through a path indicated as; electrode 205→drive unit 203→arm 201→arm 202→drive unit 204→electrode 206. Much Joule heat is generated at the drive unit 203 and 204 with a smaller sectional area, and thus, the drive units 203 and 204 are caused to thermally expand along the direction indicated by the arrows in FIG. 30(a) (along the vertical direction in the figure). As a result, the arm 201 is displaced to the right and the arm 202 is displaced to the left, setting the arms 201 and 202 in an open state.

Once the arms 201 and 202 are set in the open state as shown in FIG. 30(a), the nanotweezer 1 is moved so as to position the specimen S between the arms 201 and 202. When the arms 201 and 202 are in the open state, no electrical current flows, since the arm 201 and the arm 202 are no longer in contact with each other. As a result, the temperature at the drive units 203 and 204 decreases, setting off the natural tendency for the drive units 203 and 204 having become expanded, to resume the initial state. As the temperature becomes lower, the arms 201 and 202 move along the closing direction until they close on the specimen S as shown in FIG. 30(b). Then, the stress occurring as the drive units 203 and 204 try to contract generates the holding force with which the specimen S is grasped and held. It is to be noted that the power source 209 is turned off if the arms 201 and 202 enter an open state and that the specimen S is grasped and held in the power OFF state.

When the nanotweezer 1 is used as an observation probe in an AFM system, the arms are closed, as illustrated in FIG. 29(a), by turning off the power source 209 and the supporting member 25 is caused to vibrate by the exciter unit of the AFM system. Laser light may be radiated onto either the arm 201 or the arm 202. In this case, the front end of the arms 201 and 202, i.e., the front tip formed by the holding portions 201a and 202a in FIG. 29(a) or the front tip formed by the projections 201b and 202b in FIG. 29(b), functions as the probe portion.

While the manufacturing process for manufacturing the nanotweezer 1 includes additional steps for doping boron and for generating stress by annealing the drive units 203 and 204 having been doped with boron, the nanotweezer 1 can be otherwise manufactured by adopting a manufacturing method similar to the manufacturing method in the first embodiment or the third embodiment. As in the first and third embodiment, the drive units 203 and 204 are formed with the upper Si layer 31 (see FIG. 1) of an SOI wafer.

A mask pattern is formed on the upper Si layer 31 of the SOI wafer prepared as explained earlier and areas where the drive units 203 and 204 are to be formed are doped with boron. More specifically, boron ions are implanted at the drive unit areas by using an ion-implanting device. Subsequently, the supporting member 25, the arms 201 and 202, the drive units 203 and 204 and the like to constitute the nanotweezer 1 are formed by adopting a manufacturing method similar to the manufacturing method adopted in the first or third embodiment. Once the nanotweezer 1 is formed on the SOI wafer, the nanotweezer 1 is separated from the SOI wafer through etching and the drive units 203 and 204 are annealed through a heat treatment.

FIG. 31(a) shows the nanotweezer 1 separated from the SOI wafer, with its arms 201 and 202 in an open state. Namely, the arms 201 and 202 are formed in the open state through etching. Then, the implanted boron replaces Si at an Si lattice site through annealing. Since the atomic radius of boron is smaller than that of Si, stress along the compressing direction is generated by replacing with boron at a lattice site. As a result, the drive units 203 and 204 contract and the front ends of the arms 201 and 202 are set in a closed state, as shown in FIG. 31(b), through the heat treatment. It is to be noted that the drive units 203 and 204 may be doped with boron by using a resist mask after defining the structural elements of the nanotweezer 1 through etching.

Figure 32:
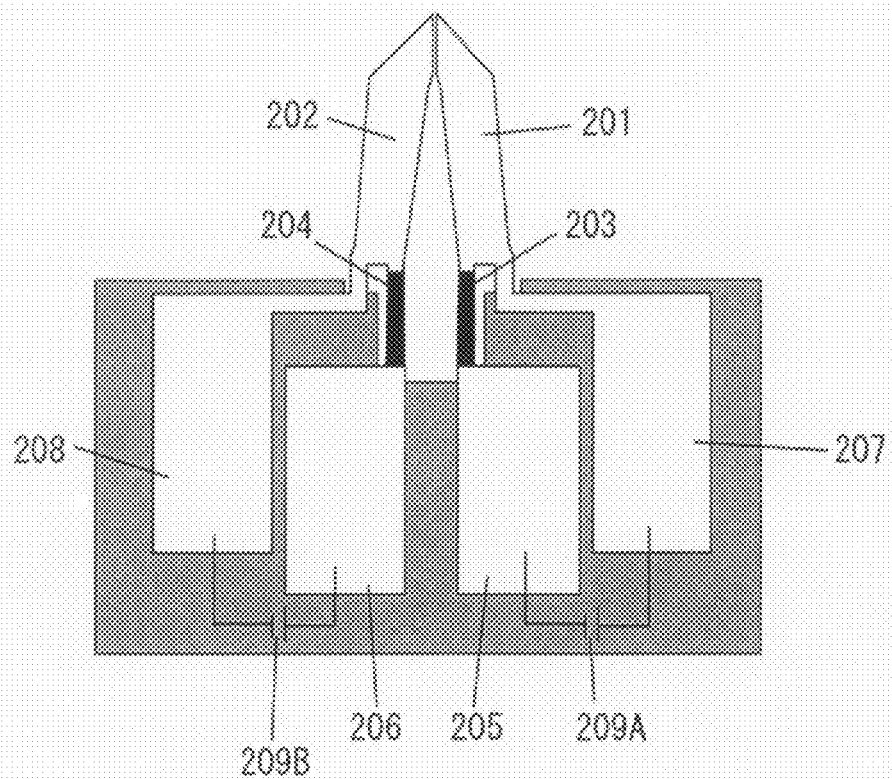
FIG. 32 A variation of the nanotweezer 1 achieved in the fourth embodiment

FIG. 32 presents an example of a variation of the nanotweezer 1 shown in FIG. 29. The nanotweezer achieved in this variation includes electrodes 207 and 208 located at the bases of the arms 201 and 202. A power source 209A is connected between the electrodes 205 and 207 and a power source 209B is connected between the electrodes 206 and 208. Thus, the arms 201 and 202 can be individually driven to open/close and by supplying an electrical current to the drive units 203 and 204 while holding the specimen, the level of the holding force can be adjusted. However, it goes without saying that the power sources 209A and 209B may remain in an OFF state while the specimen is held. It is to be noted that the nanotweezer 1 achieved in the variation can be engaged in an open/close operation similar to that of the nanotweezer illustrated in FIGS. 29 and 30 simply by connecting a power source between the electrodes 205 and 206.

While the arms 201 and 202 in either of the nanotweezers shown in FIGS. 30 and 32 are driven to open by supplying an electrical current to the drive units 203 and 204 and thus causing thermal expansion of the drive units 203 and 204, either of these nanotweezers may further include another drive mechanism in addition to the drive units 203 and 204 doped with boron, which drives the arms 201 and 202 in the opening direction. The drive units 203 and 204 in the nanotweezer adopting such a structure simply function as a force-applying mechanism that applies a force to the arms 201 and 202 along the closing direction. The drive units 203 and 204 in either of the nanotweezers illustrated in FIGS. 30 and 32, which do not include such an additional drive mechanism, function both as the force-applying mechanism and the drive mechanism. The drive mechanism may be a thermal actuator that drives the arms through the process of thermal expansion or it may be an electrostatic actuator that drives the arms by using static electricity. In addition, if the drive mechanism is provided as a component independent of the force-applying mechanism, the distance between the arms 201 and 202 prior to the annealing process may be set small enough to be considered practically zero, since the arms 201 and 202 can be subsequently set in an open state via the drive mechanism.

While the front tip of a holding portion or a projection formed at the nanotweezer is used as the probe portion during specimen observation in the first through fourth embodiments described above, a normally closed nanotweezer, such as that achieved in the fourth embodiment, with which the specimen can be held between the arms 201 and 202 in the power OFF state, can be used in specimen observation conducted by holding a probe member. In such a case, it is not necessary to form the projections 201b and 202b in FIG. 29(c).

As explained above, with the nanotweezer achieved in the fourth embodiment, which enters the closed state when the power is turned off, can be used to continuously hold the specimen in the power OFF state. Thus, power consumption at the nanotweezer in the fourth embodiment can be reduced over the normally open nanotweezers achieved in the first through third embodiments. It is to be noted that the normally closed structure is adopted in a nanotweezer which opens/closes to the left and the right in the fourth embodiment, a normally closed structure may be likewise achieved in a sliding-type nanotweezer such as that disclosed in the second or third embodiment.

It is to be noted that, the present invention may be adopted in conjunction with a single-crystal Si wafer instead of an SOI wafer used in each of the embodiments explained above. Since an Si wafer does not include an $SiO_2$ layer 32 functioning as a stopper for the ICP-RIE process, it will be necessary to control the conditions under which the ICP-RIE process is executed. In order to etch the Si wafer to a depth of 5 μm at the {100} plane of Si, a mixed gas containing $SF_6$ and $C_4F_8$, for instance, may be used as a reaction gas and in such a case, the etching process will need to be executed for approximately 1.7 minutes with the high frequency power output level set at 600 W. The use of an Si wafer, which is less expensive than an SOI wafer, and can be processed through exactly the same manufacturing steps as those described in reference to the embodiments except that the ICP-RIE process conditions need to be adjusted as described above, will achieve a further reduction in the manufacturing cost.

The present invention is not limited to the embodiments explained above in any way whatsoever, as long as the features characterizing the present invention are not compromised. For instance, the extent of change in the amplitude of the vibration at the observation probe is measured by adopting an optical lever method in the embodiments described above, any of various measurement methods, including measurement of change in the capacitance, may be adopted instead. In addition, the nanotweezer achieved in any of the embodiments may be used in, for instance, a scanning probe microscope system (SPM system) that detects static electricity or a frictional force, instead of an AFM system. Moreover, the movable arm 20 or 70 or the arms 201 and 202 may be driven by static electricity or expansion/contraction of a piezoelectric film instead of via a thermal actuator. The holding portion 22 at the movable arm 20, the holding portion 72 at the movable arm 70, or the holding portions 201a and 202a at the arms 201 and 202 or the projections 201b and 202b at the arms 201 and 202 may assume any of various shapes and they do not need to be formed in a projecting shape. Furthermore, a specimen may be observed by using the observation probe 10 or 60 or the arms 201 and 202 in a contact mode instead of the tapping mode. In addition, the observation probe 10 or 60 may also have a function of moving toward the specimen holding position as does the movable arm 20 or 70, in addition to the observation function.

The disclosures of the following priority applications are herein incorporated by reference:

Japanese Patent Application No. 2004-337842 filed Nov. 22, 2004

Japanese Patent Application No. 2005-42883 filed Feb. 18, 2005

The invention claimed is:

1. A nanotweezer, comprising:
a supporting member;
an observation probe that projects from the supporting member in a specified direction, and is used when observing a surface of a specimen;
a moveable arm that is arranged next to the observation probe projecting from the supporting member in the specified direction, and is moved closer to or farther from the observation probe to hold the specimen between the observation probe and the moveable arm or release the specimen held therebetween;
the observation probe and the moveable arm having respective surfaces parallel to each other for holding the specimen therebetween; and
a drive mechanism that drives the moveable arm so as to move the moveable arm closer to or farther from the observation probe, wherein:
the drive mechanism drives the moveable arm through thermal deformation caused by heat generated with supplied electric power or loss of heat caused by cutting the supply of power, so that the surface of the moveable arm for holding the specimen comes closer to or farther from the surface of the observation probe for holding the specimen in a state substantially parallel to each other, thereby holding the sample between the observation probe and the moveable arm or releasing the sample from therebetween.

2. A nanotweezer according to claim 1, wherein
the drive mechanism comprises a link mechanism that includes first and second connecting members integral to the supporting member at one end thereof and connected to the moveable arm at the other end thereof, wherein
the first and second connecting members have first and second cross-sectional areas, respectively, differing from each other.

3. A nanotweezer, comprising:
a supporting member;
an observation probe that extends from the supporting member along a specific direction, and includes a probe portion to be used when a surface of a specimen is observed and a first holding portion for holding the specimen;
a moveable arm that extends from the supporting member along the specific direction, is arranged next to the observation probe, and includes a second holding portion facing to the first holding portion along the specific direction; and
a drive mechanism that drives the moveable arm in linear displacement along the direction in which the moveable arm extends so as to hold the specimen between the first holding portion and the second holding portion or release the specimen from therebetween, wherein:
the first holding portion is a projection projecting out from the observation probe toward the specimen surface and includes a first holding surface extending perpendicular to the specific direction and the probe portion provided at a front end of the projection, the second holding portion includes a second holding surface for holding the specimen between the first holding surface and the second holding surface, the first holding surface and the second holding surface are formed so as to extend perpendicular to the specific direction, and the drive mechanism drives the moveable arm through thermal deformation caused by heat generated with supplied electric power or loss of heat caused by cutting the supply of power, so that the surface of the moveable arm for holding the specimen comes closer to or farther from the surface of the observation probe for holding the specimen in a state substantially parallel to each other, thereby holding the sample between the observation probe and the moveable arm or releasing the sample from therebetween.

4. A nanotweezer according to claim 3, wherein:
the first holding portion, the second holding portion and the probe portion project along a direction in which the observation probe and the moveable arm are arranged side-by-side on a side of the support.

5. A nanotweezer according to claim 3, wherein:
the first holding portion, the second holding portion and the probe portion project along a direction extending perpendicular to a direction in which the observation probe and the moveable arm are arranged side-by-side.

6. A nanotweezer according to claim 5, wherein:
the observation probe is constituted with a beam of a horseshoe-shaped member with a slit space extending along the specific direction; and
the moveable arm is arranged freely slidable along the specific direction within the slit space.

7. A nanotweezer according to claim 3, wherein:
the support, the observation probe and the moveable arm constitute a same semiconductor wafer,
the semiconductor wafer is an SOI wafer that includes an $SiO_2$ layer sandwiched between a pair of Si layers, and
the observation probe and the moveable arm are positioned side-by-side over a specific distance from each other at one of the pair of Si layers.

8. A nanotweezer according to claim 3, wherein:
the observation probe and the moveable arm are, in use, adjustable to be at ground level in potential.

9. A scanning probe microscope, comprising:
a nanotweezer according to claim 1;
a detection unit that detects a displacement attributable to an interaction between the observation probe and the specimen surface;
a control unit that controls a drive operation of the drive mechanism;
an arithmetic operation unit that determines through arithmetic operation a physical and/or chemical state at the specimen surface based upon the displacement detected by the detection unit; and
a scanning means for engaging the observation probe in scanning movement relative to the specimen surface.

10. A scanning probe microscope according to claim 9, further comprising:
a display unit that provides a visual display of results of the arithmetic operation executed by the arithmetic operation unit.

11. A scanning probe microscope according to claim 9, wherein:

the detection unit includes a light source that radiates light onto the observation probe and a light receiving unit that detects light reflected from the observation probe; and
the arithmetic operation unit determines through arithmetic operation a surface contour of the specimen based upon a detection signal provided by the light receiving unit.

12. A scanning probe microscope according to claim 9, further comprising:
an exciter unit that causes the observation probe to vibrate in a direction to the specimen with a resonance frequency selected for the observation probe in order to enable observation of the specimen in a tapping mode, wherein
the moveable arm is formed to have a resonance frequency set at a value different from the resonance frequency of the observation probe.

13. A nanotweezer, comprising:
a supporting member;
a pair of arms that are arranged side-by-side extending along a specific direction from the supporting member with holding portions having respective holding surfaces for holding a specimen therebetween each provided at one of the pair of arms;
a probe portion for observing a surface of a specimen and is provided at least one of the pair of arms;
a force-applying mechanism that applies a force to the pair of arms so as to move the arms toward each other until the holding portions at the pair of arms come in contact with each other at the holding surfaces in a state substantially parallel to each other; and
a drive mechanism that drives the pair of arms so as to move the pair of arms away from each other against the force applied by the force-applying mechanism, wherein
the nanotweezer further comprises a thermal actuator serving as the force-applying mechanism and the drive mechanism in combination, and
the thermal actuator drives the moveable arm through thermal deformation caused by heat generated with supplied electric power or loss of heat caused by cutting the supply of power, so that a distance between the holding surface of the moveable arm and the holding surface of the observation probe is adjustable in a state substantially parallel to each other, thereby holding the sample between the observation probe and the moveable arm or releasing the sample from therebetween.

14. A nanotweezer according to claim 13, wherein:
the supporting member, the pair of arms, the force-applying mechanism and the drive mechanism are each formed by processing a semiconductor wafer through a photolithography method.

15. A nanotweezer according to claim 14, wherein:
the thermal actuator comprises an annealed boron-doped Si layer and includes an electrode to which electric power is supplied.

16. A scanning probe microscope, comprising:
a nanotweezer according to claim 13,
a detection unit that detects a displacement attributable to an interaction between the arms and the specimen surface;
a control unit that controls a drive operation of the drive mechanism;

an arithmetic operation unit that determines through arithmetic operation a physical and/or chemical state at the specimen surface based upon the displacement detected by the detection unit; and a scanning means for engaging a front end of the arm in scanning movement relative to the specimen surface.

17. A scanning probe microscope according to claim 16, further comprising:

a display unit that provides a visual display of results of the arithmetic operation executed by the arithmetic operation unit.

18. A nanotweezer according to claim 13, wherein:

the pair of arms are closed when the thermal actuator is not energized and opened when the thermal actuator is energized.

19. A scanning probe microscope, comprising:

a nanotweezer according to claim 3;

a detection unit that detects a displacement attributable to an interaction between the observation probe and the specimen surface;

a control unit that controls a drive operation of the drive mechanism;

an arithmetic operation unit that determines through arithmetic operation a physical and/or chemical state at the specimen surface based upon the displacement detected by the detection unit; and a scanning means for engaging the observation probe in scanning movement relative to the specimen surface.

* * * * *